US006781409B2

(12) United States Patent
Turner

(10) Patent No.: US 6,781,409 B2
(45) Date of Patent: Aug. 24, 2004

(54) APPARATUS AND METHODS FOR SILICON-ON-INSULATOR TRANSISTORS IN PROGRAMMABLE LOGIC DEVICES

(75) Inventor: John Turner, Santa Cruz, CA (US)

(73) Assignee: Altera Corporation, San Jose, CA (US)

(*) Notice: Subject to any disclaimer, the term of this patent is extended or adjusted under 35 U.S.C. 154(b) by 47 days.

(21) Appl. No.: 10/154,394

(22) Filed: May 23, 2002

(65) Prior Publication Data

US 2003/0067321 A1 Apr. 10, 2003

Related U.S. Application Data

(60) Provisional application No. 60/328,171, filed on Oct. 10, 2001.

(51) Int. Cl.⁷ .............................................. H03K 19/177
(52) U.S. Cl. .............................. 326/41; 326/39; 326/40
(58) Field of Search ...................................... 326/37–41

(56) References Cited

U.S. PATENT DOCUMENTS

| | | | |
|---|---|---|---|
| 5,309,046 A | | 5/1994 | Steele |
| 6,365,465 B1 | * | 4/2002 | Chan et al. ................. 438/283 |
| 6,369,608 B1 | * | 4/2002 | Lesea et al. .................. 326/39 |
| 6,445,209 B1 | * | 9/2002 | Young et al. ................. 326/41 |
| 6,515,511 B2 | * | 2/2003 | Sugibayashi et al. ......... 326/41 |
| 6,529,040 B1 | * | 3/2003 | Carberry et al. .............. 326/40 |

OTHER PUBLICATIONS

Toru Nakura et al., "A 3.6–Gb/s 340–mW 16:1 Pipe–Lined Multiplexer Using 0.18 μm SOI–CMOS Technology," IEEE Journal of Solid–State Circuits, vol. 35, No. 5, May 2000, pp. 751–756.

Fariborz Assaderaghi et al., "A Dynamic Threshold Voltage MOSFET (DTMOS) For Ultra–Low Voltage Operation," IEEE, 1994, pp. 809–812.

Brandon Chase, "Rushing The Double–Gate," Scientific American: Technology and Business, Mar. 1999, 2 pgs.

Ricardo Gonzalez et al., "Supply and Threshold Voltage Scaling For Low Power CMOS," IEEE Journal of Solid–State Circuits, vol. 32, No. 8, Aug. 1997, pp. 1210–1216.

"IBM Research News, IBM Advances New Form of Transistor To Improve Chips," http://www.research.ibm.com/resources/news/20011203 transisotr.shtml, Dec. 3, 2001, 2 pgs.

* cited by examiner

*Primary Examiner*—Michael Tokar
*Assistant Examiner*—Vibol Tan
(74) *Attorney, Agent, or Firm*—O'Keefe, Egan & Peterman

(57) ABSTRACT

A programmable logic device (PLD) includes programmable electronic circuitry. The programmable electronic circuitry allows programming the functionality of the PLD. The programmable electronic circuitry includes one or more of programmable interconnects, pass devices, look-up table circuits, and/or multi-input logic circuits. Each of the programmable interconnects, pass devices, look-up table circuits, and/or multi-input logic circuits includes one or more of dynamic threshold metal oxide semiconductor (DTMOS) transistors, fully depleted metal oxide semiconductor (FDMOS) transistors, partially depleted metal oxide semiconductor (PDMOS) transistors, and/or double-gate metal oxide semiconductor transistors.

14 Claims, 12 Drawing Sheets

APPARATUS AND METHODS FOR SILICON-ON-INSULATOR TRANSISTORS IN PROGRAMMABLE LOGIC DEVICES

CROSS-REFERENCE TO RELATED APPLICATIONS

This patent application claims priority to, and incorporates by reference, U.S. Provisional Patent Application Serial No. 60/328,171, titled "Apparatus and Methods for Programmable Interconnect in Programmable Logic Devices with Low Supply Voltages," filed on Oct. 10, 2001.

BACKGROUND

A typical programmable logic device (PLD) uses conventional N-type metal oxide semiconductor (NMOS) or complementary metal oxide semiconductor (CMOS) transistors. Control voltages within the PLD cause the NMOS or CMOS transistors to turn on or off, thus providing programmable circuitry within the PLD.

Like many other electronic devices, supply voltages for typical PLDs have tended to decrease. The decreased supply voltages often accompany higher speeds of operation and lower power dissipation. The trend towards decreased supply voltages, however, has tended to make the operation of pass transistors and, therefore, the operation of the overall PLD, less reliable.

As the supply voltage decreases, transistors within the PLD (for example, NMOS pass transistors) have increasing difficulty in transmitting a logic 1 (i.e., logic high) level. With sufficiently small power-supply voltages, the pass transistors fail to reliably transmit a logic 1 level, thus causing circuit failure. This problem becomes even more acute in situations where the PLD includes the cascade of several transistors, such as several pass transistors in series. A need therefore exists for transistors that can reliably transmit both binary logic levels (i.e., both logic 0 and logic 1 levels) in PLDs, even with relatively small power-supply voltages.

SUMMARY

This invention contemplates PLDs that include silicon-on-insulator (SOI) metal oxide semiconductor (MOS) transistors. In one embodiment, a PLD according to the invention includes programmable electronic circuitry that includes a plurality of SOI transistors. The programmable electronic circuitry allows programming the functionality of the PLD. More particularly, the programmable electronic circuitry includes: (a) at least one dynamic threshold metal oxide semiconductor (DTMOS) transistor, (b) at least one fully depleted metal oxide semiconductor (FDMOS) transistor, (c) at least one partially depleted metal oxide semiconductor (PDMOS) transistor, or (d) at least one double-gate metal oxide semiconductor transistor, or a combination thereof.

In another embodiment, a PLD according to the invention includes programmable electronic circuitry that includes a plurality of double-gate MOS transistors. The programmable electronic circuitry allows programming the functionality of the PLD. More particularly, the programmable electronic circuitry may include a programmable interconnect, a pass transistor, a look-up table circuit, and a multi-input logic circuit. The programmable interconnect couples to the pass transistor, the look-up table circuit, and the multi-input logic circuit.

In a third embodiment, a PLD according to the invention includes programmable interconnect circuitry, an SOI pass transistor, and a look-up table circuit. The programmable interconnect circuitry provides configurable interconnections within the PLD, and includes a first SOI transistor. The SOI pass transistor and the look-up table circuit both couple to the programmable interconnect circuitry. The look-up table circuit includes a second SOI transistor.

In another embodiment according to the invention, a PLD includes programmable interconnect circuitry that has at least one dynamic threshold metal oxide semiconductor (DTMOS) SOI transistor. The programmable interconnect circuitry couples together various electronic circuitry within the PLD. The PLD also includes at least one DTMOS pass transistor that couples to the programmable interconnect circuitry. Furthermore, the PLD includes at least one look-up table circuit, having at least one DTMOS SOI transistor, that also couples to the programmable interconnect circuitry.

In a fifth embodiment, a data-processing system according to the invention includes a PLD. The PLD includes programmable electronic circuitry, which has a plurality of MOS transistors. The data-processing system also includes at least one peripheral device coupled to the PLD. The plurality of MOS transistors includes at least one SOI transistor.

More particularly, the PLD may include at least one programmable interconnect, at least one pass transistor, at least one look-up table circuit, and at least one multi-input logic circuit. Each of the at least one programmable interconnect, the at least one pass transistor, the at least one look-up table circuit, and the at least one multi-input logic circuit includes one or more of: (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or (d) a double-gate metal oxide semiconductor transistor, or a combination thereof.

Another aspect of the invention relates to methods of processing data using a PLD. In one embodiment, the method includes receiving and processing input data in programmable electronic circuitry included within the PLD. The programmable electronic circuitry includes at least one SOI transistor.

More particularly, receiving and processing the input data according to the method includes: (a) using at least one programmable interconnect within the programmable interconnect circuitry; (b) using at least one pass transistor coupled to the at least one programmable interconnect circuitry; (c) using at least one look-up table circuit coupled to the at least one programmable interconnect; and (d) using at least one multi-input logic circuit coupled to the at least one programmable interconnect. Each of the at least one programmable interconnect, the at least one pass transistor, the at least one look-up table circuit, and the at least one multi-input logic circuit includes one or more of (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or (d) a double-gate metal oxide semiconductor transistor, or a combination thereof.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

Figure 1:
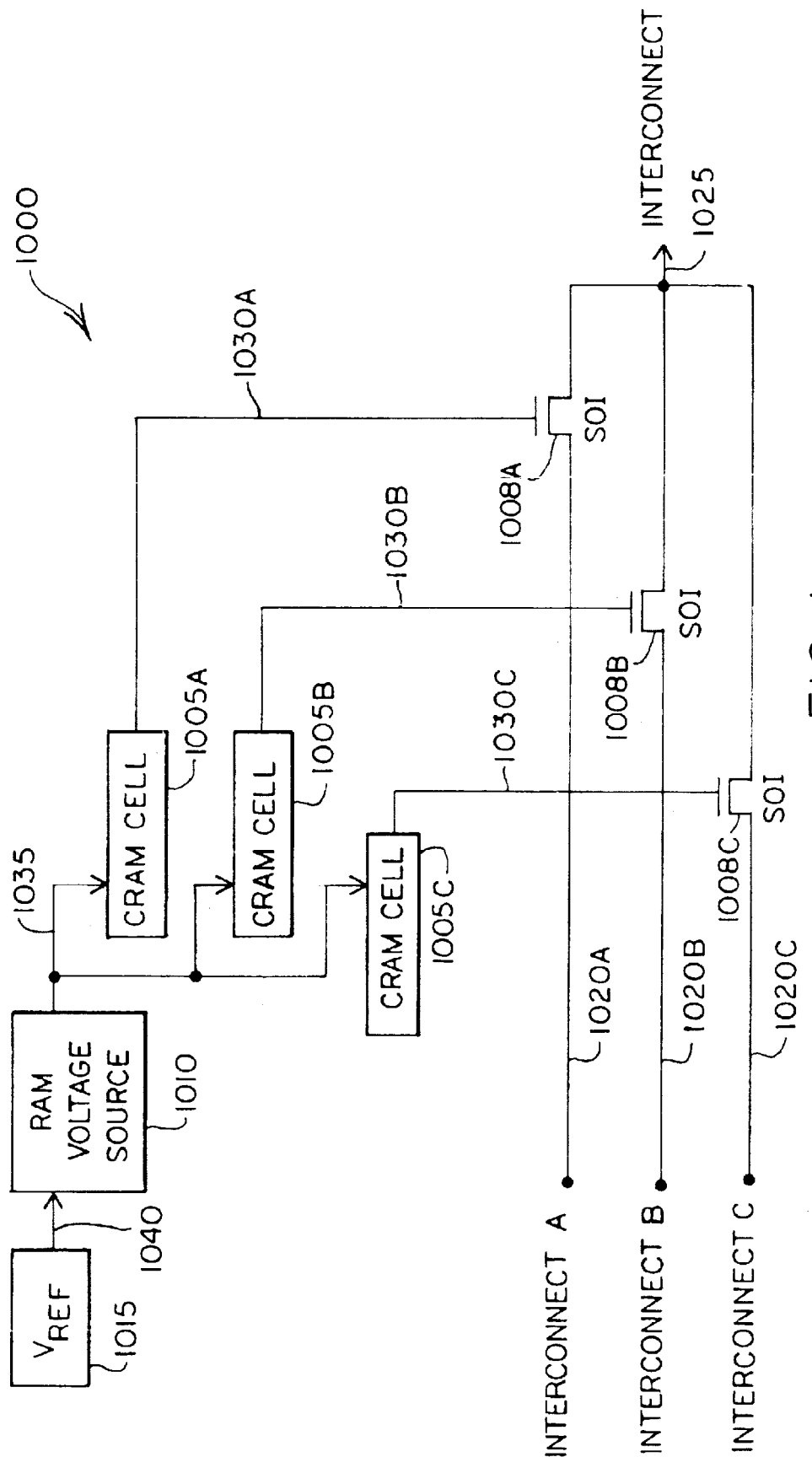
FIG. 1 shows a portion of a PLD according to one embodiment of the invention that includes a programmable interconnect.

This invention contemplates PLDs using SOI MOS transistors and structures that allow the PLDs to operate reliably from relatively low power supply-voltages. For example, for dynamic-threshold MOS transistors (described below in detail), one may use power-supply voltages of about 0.7 or lower, whereas for other SOI transistors, one may use power-supply voltages of around 1.2 volts, or other voltages, as desired. Employing SOI transistors in PLDs according to the invention enables those PLDs to operate from relatively low power-supply voltages.

In exemplary embodiments, PLDs according to the invention use MOS transistors fabricated using SOI and/or double-gate techniques, in various areas of those PLDs, including programmable interconnect, pass transistors or devices, look-up table circuits, and multi-input logic circuits and gates or, generally, in programmable electronic circuitry in the PLDs. The SOI transistors in PLDs according to the invention can reliably transmit logic 1 as well as logic 0 levels even when the PLDs operate from relatively low power-supply voltages.

PLDs according to the invention include programmable or configurable electronic circuitry. The programmable electronic circuitry provides at least in part the programmability of the overall functionality of the PLDs. The programmable electronic circuitry may include programmable interconnect circuitry, pass devices or transistors, look-up table circuits, Boolean-logic circuits, logic gates, sequential-logic circuits, etc., as persons skilled in the art with the benefit of the description of the invention understand. The various components and circuitry within the programmable electronic circuitry may couple to one another, either directly or indirectly. For example, programmable interconnect circuitry may couple directly to a pass device or transistor or, alternatively, it may couple to the pass device or transistor through another circuit or block(s) of circuitry, such as a multiplexer, or a series of such circuits or block(s) of circuitry.

The programmable interconnect circuitry may include interconnects laid out within the PLD in horizontal and vertical directions. The programmable interconnect circuitry couples together (either directly or indirectly) various parts of the PLD, such as programmable logic circuitry (e.g., look-up table circuits, gates, etc.), to allow programming the functionality of the PLD. The structure and circuitry of the programmable or configurable electronic circuitry, programmable logic circuitry, and programmable interconnects falls within the knowledge of persons of ordinary skill in the art who have the benefit of the description of the invention.

As noted, one may use a variety of MOS structures in PLDs according to the invention. Some examples include dynamic threshold MOS (DTMOS), partially depleted MOS (PDMOS), fully depleted MOS (FDMOS), and double-gate MOS, as described below in detail. The notation "SOI" next to the transistors in the accompanying figures indicates that one may fabricate the transistors using SOI techniques.

One may use SOI transistors in several areas of a PLD, including: (a) programmable interconnects, (b) series pass transistors, (c) look-up table (LUT) circuits, and (d) multi-input logic circuits (such as multi-input NAND gates), as described below in detail. Generally, one may use any of the varieties of MOS structures (e.g., double-gate MOS transistors) described below in each of these applications, as desired. Furthermore, one may use a combination of two or more of the MOS structures, as persons of ordinary skill in the art who have the benefit of the description of the invention understand.

Note that, although the accompanying figures and corresponding description may include the "SOI" notation for some of the transistors, one may use SOI transistors in other parts of the circuitry, as desired. In other words, one may implement using SOI other parts of the circuit, or the entire circuit, as desired. Implementing each circuit, for example, the interconnect or look-up table, entirely in SOI may result in more efficient fabrication (fewer fabrication steps, simpler steps, and/or less complexity), as persons of ordinary skill in the art with the benefit of the description of the invention understand.

FIG. 1 shows a portion of a PLD according to an embodiment 1000 of the invention. The PLD includes NMOS transistors 1008A, 1008B, and 1008C. Transistors 1008A–1008C constitute SOI NMOS transistors. The PLD also includes configuration random-access memory (CRAM) cells 1005A, 1005B, and 1005C, random-access memory (RAM) voltage source 1010, and a reference voltage source 1015.

The CRAM cells 1005A–1005C may reside within a CRAM device or circuitry (not shown explicitly) and store configuration data for the PLD. Among other things, the user may use the configuration data in the CRAM (for example, the data within the CRAM cells 1005A–1005C) to specify the programmable interconnects within the PLD, such as the interconnect shown in FIG. 1. In other words, the user may program the CRAM cells 1005A–1005C by storing data bits within those cells.

In exemplary embodiments, the PLD loads CRAM cells at device power-up by retrieving data from a data source. The data source provides user-specified data that determine the configuration and functionality of the PLD. The data source may constitute a variety of devices, such as a memory (e.g., a read-only memory (ROM), flash memory, erasable ROM, non-volatile memory, etc.), a source that supplies a bit-stream of data, a storage device, and the like, as desired.

The CRAM cells 1005A–1005C provide control signals 1030A–1030C to NMOS SOI transistors 1008A–1008C. Depending on the data bits stored in CRAM cells 1005A–1005C, each of the control signals 1030A–1030C may turn on a respective one of NMOS SOI transistors 1008A–1008C. A logic high level on one of the control signals 1030A–1030C turns on the respective one of NMOS SOI transistors 1008A–1008C. When one of the NMOS transistors 1008A–1008C turns on, it couples the corresponding one of interconnects 1020A–1020C to interconnect 1025.

Conversely, a logic low level on one of the control signals 1030A–1030C turns off the respective one of NMOS SOI transistors 1008A–1008C. The SOI transistor that is in the off state decouples the corresponding one of interconnects 1020A–1020C from interconnect 1025. Thus, by programming the CRAM cells 1005A–1005C, the user can selectively couple each of interconnects 1020A–1020C to interconnect 1025, as desired, and thus realize a programmable interconnect within the PLD. Programming similar interconnects allows the user to specify and control the overall functionality that the PLD realizes. As noted above, the programmable interconnect circuitry couples together various parts of the PLD, such as programmable logic circuitry, to provide the overall programmable functionality of the PLD as specified by the user.

The reference voltage source 1015 supplies a voltage to RAM voltage source 1010 via an output 1040. RAM voltage source 1010 derives a voltage from the voltage at output 1040 of reference voltage source 1015 and supplies the derived voltage to CRAM cells 1005A–1005C via an output 1035.

In exemplary embodiments, one may set the voltage at the output 1035 of RAM voltage source 1010 to a desired level. If transistors 1008A–1008C have their respective gates coupled to their respective bodies (as described below in detail), one should set the voltage at output 1035 of RAM voltage source to a level that avoids forward-biasing of the junction between the substrate and the source region of pass transistors 1008A–1008C. The CRAM cells 1005A–1005C may also set the voltage of the control signals 1030A–1030C to that level, thus avoiding a leakage path in pass transistors 1008A–1008C through forward-biased junctions. One may omit RAM voltage source 1010 and reference voltage source 1015 if one uses a sufficiently low power-supply voltage (for example, less than about 0.7 volts) that avoids forward-biasing the substrate junction in the MOS transistors.

By using SOI transistors rather than conventional MOS transistors, the PLD in embodiment 1000 can operate with lower supply voltages. In other words, programmable interconnects employing SOI transistors in the PLD in embodiment 1000 allow reliable transmission of logic 0 and logic 1 levels in the PLD even when operating from reduced power-supply voltages.

Figure 2:
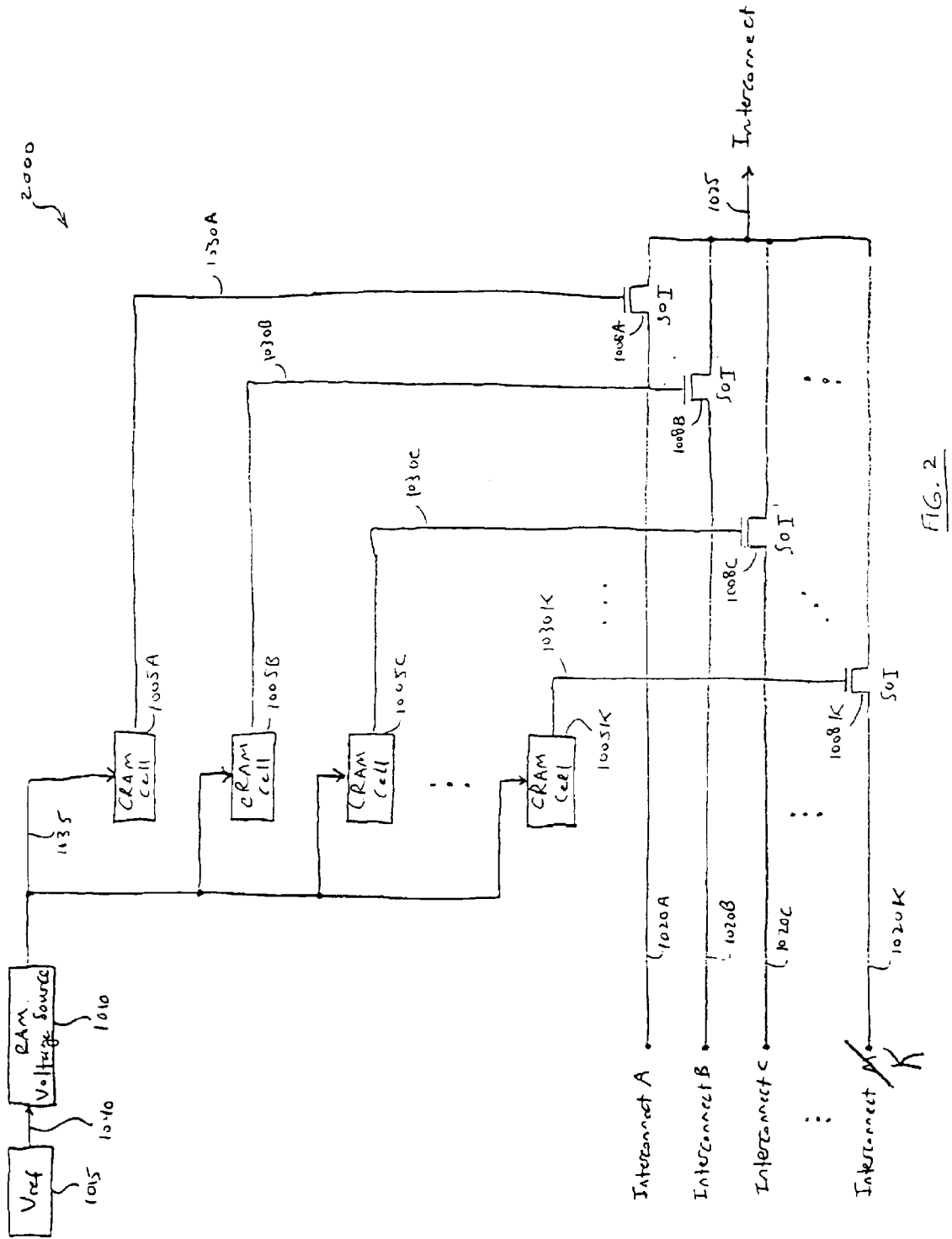
FIG. 2 illustrates a portion of a PLD according to another embodiment of the invention that includes a programmable interconnect.

Note further that FIG. 1 illustrates three CRAM cells 1005A–1005C, three SOI transistors 1008A–1008C, and three interconnects 1020A–1020C coupled to interconnect 1025. As persons of ordinary skill in the art who have the benefit of the description of the invention understand, however, one may generalize the inventive concept embodied in FIG. 1, as desired. In other words, one may use other quantities of CRAM cells, SOI transistors, and interconnects. FIG. 2 depicts such a generalized circuit arrangement.

More specifically, FIG. 2 shows a portion of a PLD according to an embodiment 2000 of the invention. Embodiment 2000 is similar to embodiment 1000, contains similar elements, and operates in a similar manner. Unlike embodiment 1000, however, embodiment 2000 includes K CRAM cells 1005A–1005K, K SOI transistors 1008A–1008K, and K interconnects 1020A–1020K. Similar to embodiment 1000, the PLD in embodiment 2000 includes (if the transistors used have their respective gates coupled to their respective bodies) random-access memory (RAM) voltage source 1010, and a reference voltage source 1015.

Similar to embodiment 1000, in embodiment 2000 CRAM cells 1005A–1005K provide control signals 1030A–1030K to SOI transistors 1008A–1008K. Depending on the data bits stored in CRAM cells 1005A–1005K, each of the control signals 1030A–1030K may turn on a respective one of SOI transistors 1008A–1008K. By programming the CRAM cells 1005A–1005K, the user can selectively couple each of interconnects 1020A–1020K to interconnect 1025, and thus realize a programmable interconnect within the PLD with a particular functionality. In other words, embodiment 2000 realizes a programmable interconnect that can select its input signal from K input signals, based on the data bits stored in K CRAM cells. Note that, as discussed above, depending on the power-supply voltages used, one may omit RAM voltage source 1010 and reference voltage source 1015.

Note that, similar to embodiment 1000, programmable interconnects employing SOI transistors in the PLD in embodiment 2000 allow reliable operation of the PLD with reduced power-supply voltages. Put another way, the transistors in the PLD in embodiment 2000 transmit logic 0 and 1 levels reliably even when operating from relatively low power-supply voltages. One may use any of the variety of MOS transistors described below as transistors 1008A–1008K, as desired.

Furthermore, note that embodiment 1000 and embodiment 2000 in FIGS. 1 and 2, respectively, show a single programmable interconnect 1025. One may, however, replicate embodiment 1000 and, more generally, embodiment 2000, to realize a desired number of programmable interconnects, as desired. In other words, by using replica of the circuitry in embodiment 1000 and/or embodiment 2000, one may implement desired numbers and/or configurations of interconnects within a PLD, as desired. The appropriate number, configuration, and/or functionality of the programmable interconnects depends on the design and performance specifications for a given application, as persons of ordinary skill in the art who have the benefit of the description of the invention understand.

As another application, one may also use the MOS structures described here as pass transistors or devices in PLDs according to the invention. Generally, one may use the MOS transistors in PLDs according to the invention wherever a conventional PLD would use a pass transistor or device. Examples of applications include multiplexers, such as series coupled or cascaded multiplexers, and selective coupling between any two points or nodes within the PLD.

The pass devices may couple to the programmable interconnect and to other parts of the PLD, for example programmable logic circuitry, which may include look-up table circuits, logic gates, and the like, as persons of ordinary skill in the art who have the benefit of the description of the invention understand. Thus, the pass devices may provide part of the programmable fabric of the PLD, as desired.

Figure 3:
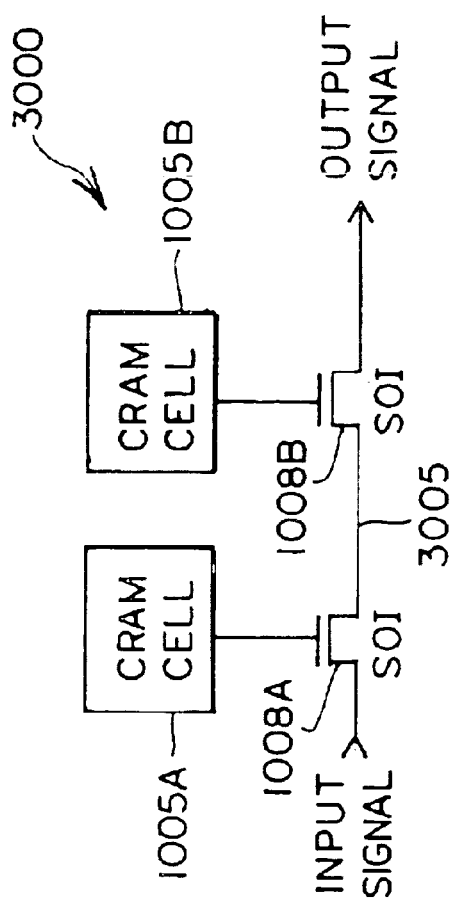
FIG. 3 depicts an embodiment of a portion of a PLD according to the invention that uses series pass devices.

FIG. 3 shows an embodiment 3000 of a portion of a PLD according to the invention that uses series SOI pass transistors. Embodiment 3000 includes SOI transistors 1008A and 1008B, and CRAM cells 1005A and 1005B. The SOI transistors 1008A–1008B and CRAM cells 1005A–1005B operate in a similar manner as those in embodiments 1000 and 2000 described above.

SOI transistor 1008A receives an input signal from the output of CRAM cell 1005A. Depending on the value of the output of CRAM cell 1005A, SOI transistor 1008A selectively passes the input signal to SOI transistor 1008B. More specifically, if the output of CRAM cell 1005A has a logic 0 value, SOI transistor 1008A is in the off state and does not conduct current (except for sub-threshold leakage current and the like). Thus, SOI transistor 1008A decouples the input signal from SOI transistor 1008B (i.e., SOI transistor 1008A provides a relatively high impedance between its drain and source).

On the other hand, if the output of CRAM cell 1005A has a logic 1 value, SOI transistor 1008A turns on and provides a relatively low impedance to current flow. As a result, SOI transistor 1008A couples the input signal to intermediate node 3005 (effectively to SOI transistor 1008B). In other words, because of the relatively low impedance between the source and drain of SOI transistor 1008A, the signal at intermediate node 3005 is the same as the input signal (except for any losses or distortions that non-ideal characteristics of SOI transistor 1008A may cause).

CRAM cell 1005B and SOI transistor 1008B operate in a similar manner. In other words, if the output of CRAM cell 1005B has a logic 0 value, SOI transistor 1008B is in the off state and does not conduct current (except for sub-threshold leakage current and other non-ideal behavior). Accordingly, SOI transistor 1008B decouples intermediate node 3005 from the output node. If, however, if the output of CRAM cell 1005B has a logic 1 value, SOI transistor 1008B turns on. Consequently, SOI transistor 1008B couples intermediate node 3005 to the output node. In other words, the output signal is substantially a replica of the signal at intermediate node 3005 (except for any losses or distortions because of non-ideal characteristics of SOI transistor 1008B).

Note that, by controlling the values of the output signals of CRAM cells 1005A–1005B, one may selectively provide the input signal to intermediate node 3005 and/or the output of embodiment 3000. By providing logic 0 values as output signals of CRAM cells 1005A–1005B, SOI transistors 1008A–1008B both turn off. Intermediate node 3005 and the output both float (in other words, other signals may drive those nodes).

If the output signal of CRAM cell 1005A has a logic 1 value and the output signal of CRAM cell 1005B has a logic 0 value, SOT transistor 1008A provides the input signal to intermediate node 3005, but SOI transistor 1008B decouples intermediate node 3005 from the output node. The reverse of the latter situation occurs if the values at the outputs of CRAM cells 1005A and 1005B reverse. In other words, SOI transistor 1008A decouples the input from intermediate node 3005, while SOI transistor 1008B couples intermediate node 3005 to the output. If the output signals of CRAM cells 1005A and 1005B both have logic 1 values, SOI transistors 1008A and 1008B both turn on and couple the input to both the output and intermediate node 3005.

Intermediate node 3005 may couple to various areas of the PLD, as desired. Embodiment 3000 may receive its input signal from within or outside the PLD and may provide its output signal to other parts of the PLD or as an output signal of the PLD. Note that embodiment 3000 shows a cascade of two SOI transistors. One may, however, use a single SOI transistor as a pass transistor, as desired. As another alternative, one may use a cascade of more than one or two SOI transistors, as persons of ordinary skill in the art who have the benefit of the description of the invention understand. One may use any of the MOS transistors described below as transistors 1008A–1008B, as desired. Moreover, as persons of ordinary skill in the art with the benefit of the description of the invention understand, one may insert other circuitry, such as buffers, inverters, gates, and the like between pass devices (between transistors 1008A–1008B), as desired.

Figure 4:
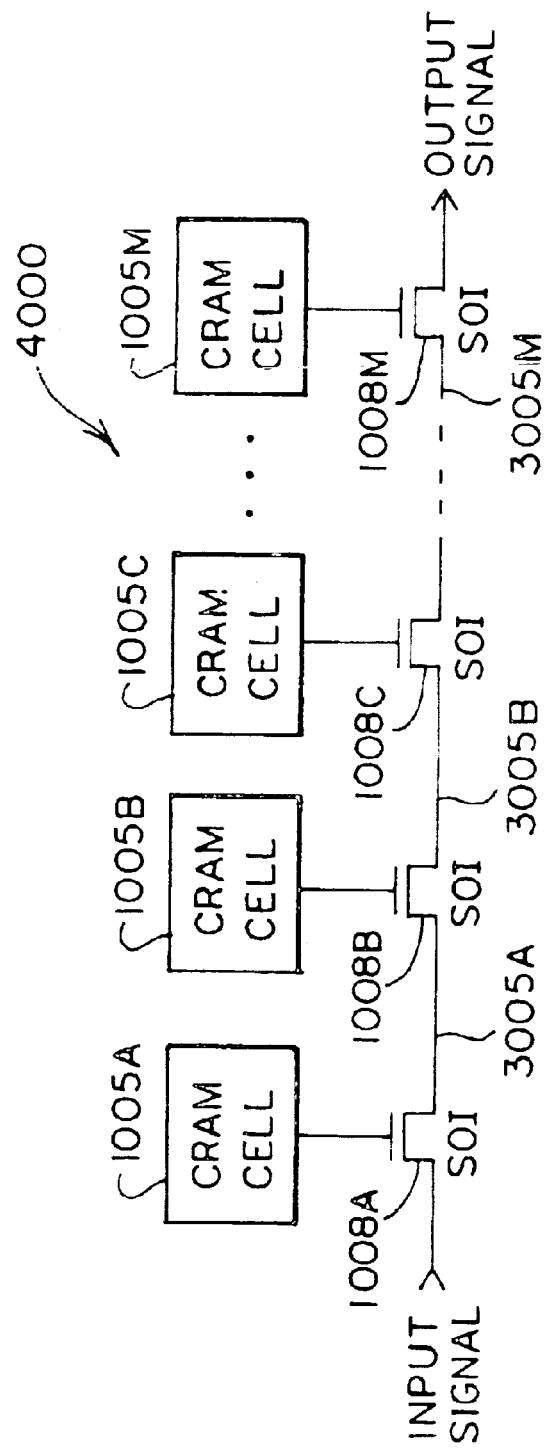
FIG. 4 shows another embodiment of a portion of a PLD according to the invention that uses series pass devices.

FIG. 4 shows another embodiment 4000 of a portion of a PLD according to the invention that uses series SOI pass transistors. Embodiment 4000 is a more general implementation of embodiment 3000. Thus, embodiment 4000 is similar to embodiment 3000, contains similar elements, and operates in a similar manner. Unlike embodiment 3000, however, embodiment 4000 includes M CRAM cells 1005A–1005M, M SOI transistors 1008A–1008M, and M intermediate nodes 3005A–3005M.

Similar to embodiment 3000 described above, in embodiment 4000 CRAM cells 1005A–1005M provide output signals that control SOI transistors 1008A–1008M, respectively. Depending on the data bits stored in CRAM cells 1005A–1005M, one or more of SOI transistors 1008A–1008M may turn on. By programming the CRAM cells 1005A–1005M, the user can selectively couple the circuit's input and the output to one or more intermediate nodes 3005A–3005M, and/or couple one or more intermediate nodes 3005A–3005M to one another. Intermediate nodes 3005 and/or 3005A–3005M may be available to, or drive, other nodes or circuitry within the PLD, as desired.

Note that embodiments 3000 and 4000 in FIGS. 3 and 4, respectively, show a single cascade of SOI transistors (or a single SOI pass transistor). One may, however, replicate embodiment 3000 and, more generally, embodiment 4000, to realize a desired number of cascaded SOI transistor (or single SOI pass transistors), as desired. The appropriate number, configuration, and/or functionality of the SOI pass transistors or cascades of SOI transistors depends on the design and performance specifications for a given application, as persons of ordinary skill in the art who have the benefit of the description of the invention understand.

Embodiments 3000 and 4000 show control signals obtained from CRAM cells 1005A–1005B or 1005A–1005M. One may use other signals to control SOI transistors 1008A–1008B or 1008A–1008M, as desired. For example, one may use inputs to the PLD, signals at other points or from other circuitry in the PLD, logic signals derived by the circuitry within the PLD, etc. Regardless of the source of the signals that control the SOI transistors, using SOI transistors allows reliable transmission of logic 1 signals in PLDs that operate from relatively low supply voltages. Furthermore, note that one may use any of the MOS transistors described below as transistors 1008A–1008B in embodiment 3000 or transistors 1008A–1008M in embodiment 4000, as desired. As noted above, one may insert other circuitry, such as buffers, inverters, gates, and the like between pass devices (between two of transistors 1008A–1008M), as desired.

One may also use SOI transistors in PLD look-up table (LUT) circuits. The look-up table circuits may couple to programmable interconnects, pass devices, and/or other parts of the PLD, for example programmable logic circuitry that may include logic gates and the like, as persons of ordinary skill in the art who have the benefit of the description of the invention understand. Thus, the look-up table circuits may provide part of the programmable fabric of the PLD, as desired.

Figure 5:
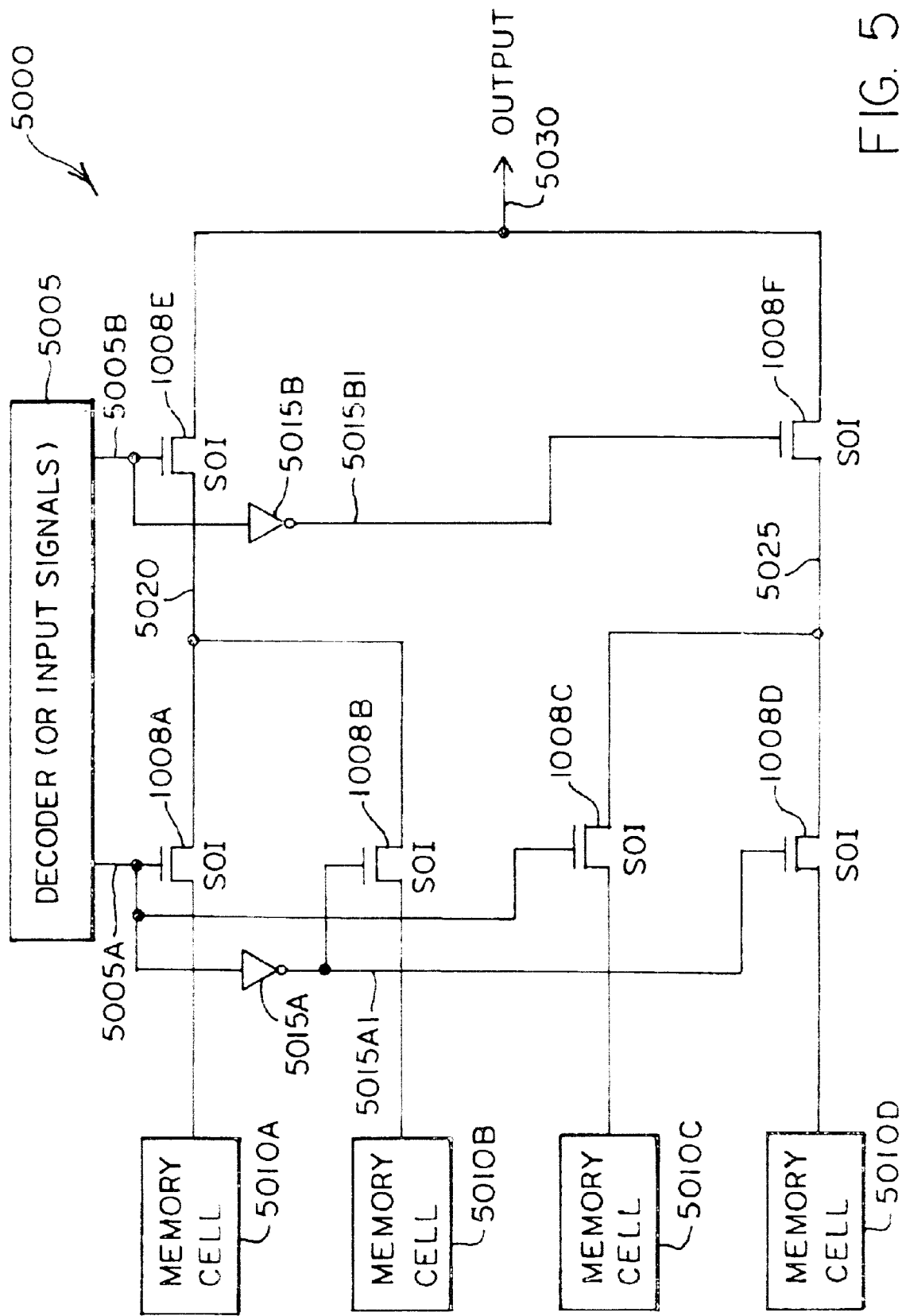
FIG. 5 illustrates an embodiment of a portion of a PLD according to the invention that incorporates a look-up table circuit.

FIG. 5 shows an embodiment 5000 of a portion of a PLD according to the invention that incorporates SOI transistors in a look-up table circuit. Embodiment 5000 includes memory cells 5010A–5010D, SOI transistors 1008A–1008F, decoder 5005, and inverters 5015A–5015B. The combination of memory cells 5010A–5010D, SOI transistors 1008A–1008F, and inverters 5015A–5015B provides a look-up table circuit.

Decoder 5005 may also constitute part of the look-up table circuit or, alternatively, may reside in another part or circuit within the PLD and supply input signals 5005A–5005B to the look-up table, as desired. As another alternative, another circuit (not shown explicitly) within or outside the PLD may supply input signals 5005A–5005B to the look-up table, as desired. Decoder 5005 (or other source of input signals) operates in a manner that persons skilled in the art with the benefit of the description of the invention understand. Note that, although the look-up circuit in FIG. 5 operates in response to two signals 5005A–5005B, one may generally provide look-up table circuits with other numbers of inputs signals (e.g., 4 or 6), as persons skilled in the art with the benefit of the description of the invention understand.

The look-up table selectively supplies the contents of memory cells 5010A–5010D to output 5030. The look-up table does so depending on the logic values of input signals 5005A–5005B. In normal operation, the look-up table circuit supplies the output signal of one of memory cells 5010A–5010D to output 5030. By storing the truth table or a desired logic response in memory cells 5010A–5010D, one may provide an output signal that corresponds to that truth table or logic response. Examples of logic responses include AND, NAND, OR, NOR, XOR, XNOR, adders, data converters, etc., as persons skilled in the art understand.

Depending on the logic value of input signal 5005A, one of SOI transistors 1008A–1008B turns on and, consequently, couples the output of a respective one of memory cells 5010A–5010B to intermediate node 5020. If input signal 5005A has a logic low value, SOI transistor 1008A is in the off state, thus decoupling the output of memory cell 5010A from intermediate node 5020. In response to the logic low value of input signal 5005A, inverter 5015A provides a logic high value as its output signal 5015A1. As a result, SOI transistor 1008B turns on and couples the output of memory cell 5010B to intermediate node 5020.

If input signal 5005A has a logic high value, however, SOI transistor 1008A is in the on state and couples the output of memory cell 5010A to intermediate node 5020. Because of the logic high value of input signal 5005A, inverter 5015A provides a logic low value as its output signal 5015A1. Consequently, SOI transistor 1008B turns off and decouples the output of memory cell 5010B from intermediate node 5020.

SOI transistors 1008C and 1008D operate in a manner similar to SOI transistors 1008A and 1008B, respectively. More specifically, consider the situation where input signal 5005A has a logic low value. SOI transistor 1008C is in the off state and decouples the output of memory cell 5010C from intermediate node 5025. In response to the logic low value of input signal 5005A, inverter 5015A provides a logic high value as its output signal 5015A1. Accordingly, SOI transistor 1008D turns on and couples the output of memory cell 5010D to intermediate node 5025.

On the other hand, suppose that input signal 5005A has a logic high value. SOI transistor 1008C turns on and couples the output of memory cell 5010C to intermediate node 5025. As a consequence of the logic high value of input signal 5005A, inverter 5015A provides a logic low value as its output signal 5015A1. SOI transistor 1008D therefore turns off and decouples the output of memory cell 5010D from intermediate node 5025.

Input signal 5005B causes the transmission of one of the signals present at intermediate nodes 5020 and 5025 to output 5030. In other words, depending on the logic value of input signal 5005B, SOI transistors 1008E and 1008F provide one of the signals at intermediate nodes 5020 and 5025 as output signal 5030. If input signal 5005B has a logic low value, SOI transistor 1008E is in the off state, thus decoupling intermediate node 5020 from output 5030. In response to the logic low value of input signal 5005B, inverter 5015B provides a logic high value as its output signal 5015B1. As a result, SOI transistor 1008F turns on and couples intermediate node 5025 to output 5030.

Now consider the situation where input signal 5005B has a logic high value. SOI transistor 1008E is in the on state and couples intermediate node 5020 to output 5030. Because of the logic high value of input signal 5005B, inverter 5015B provides a logic low value as its output signal 5015B1. Consequently, SOI transistor 1008F turns off and decouples intermediate node 5025 from output 5030. Thus, overall, SOI transistors 1008A–1008F, under the control of input signals 5005A and 5005B, provide the output signal of one of memory cells 5010A–5010D as output signal 5030.

Note that embodiment 5000 shows a cascade of two SOI transistors in the look-up table circuit (for example, the cascade of SOI transistors 1008A and 1008E). One may, however, use a single SOI transistor as a pass transistor or device in PLDs according to the invention, as desired.

For example, one may modify FIG. 5 to provide a two-memory-cell look-up table circuit according to the invention that uses a single SOI pass transistor in the data path for each memory cell. To do so, one may omit SOI transistors 1008A–1008D, memory cells 5010B–5010C, and inverter 5015A from embodiment 5000. One may further couple the output of memory cell 5010A to SOI transistor 1008E, and couple the output of memory cell 5010D to SOI transistor 1008F. The resulting look-up table circuit includes memory cells 5010A and 5010D, SOI transistors 1008E and 1008F, and inverter 5015B. Depending on the logic value of input signal 5005B, SOI transistors 1008E–1008F couple the output of one of memory cells 5010A and 5010D to output 5030, in the similar manner to that described above.

Figure 6:
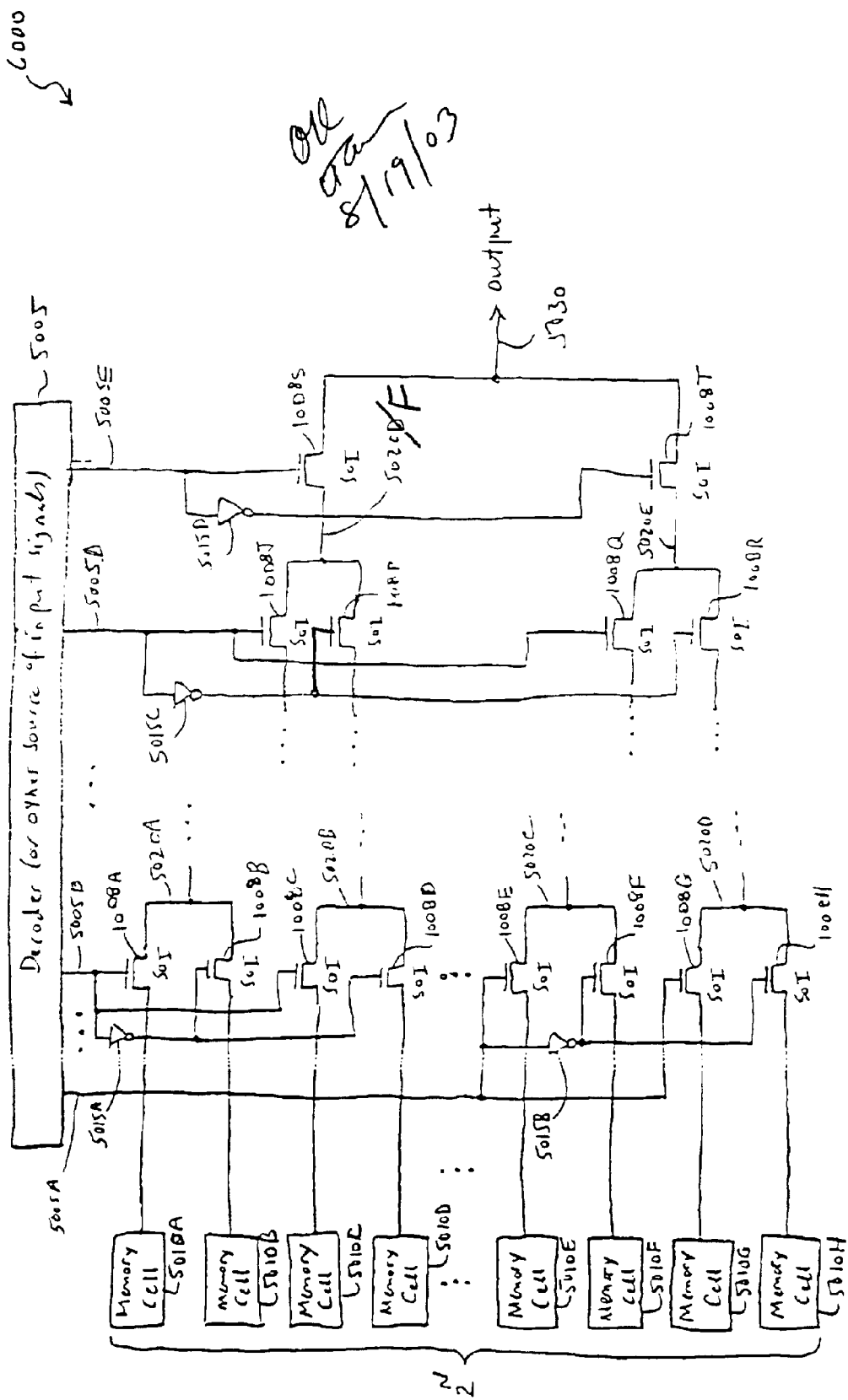
FIG. 6 depicts another embodiment of a portion of a PLD according to the invention that incorporates a look-up table circuit.

As another alternative, one may use a cascade of more than one or two SOI transistors, as persons of ordinary skill in the art who have the benefit of the description of the invention understand. FIG. 6 shows another embodiment 6000 of a portion of a PLD according to the invention that uses cascaded SOI pass transistors or devices.

Embodiment 6000 is similar to embodiment 5000, contains similar elements, and operates in a similar manner. Unlike embodiment 5000, however, embodiment 6000 includes N input signals (labeled 5005A–5005E) and $2^N$ memory cells (labeled 5010A–5010H), where N constitutes an integer number greater than 2. Embodiment 6000 also includes inverters (labeled as 5015A–5015D), SOI transistors (labeled as 1008A–1008T), input signals 5005A–5005E, intermediate nodes (labeled as 5020A–5020F), and decoder 5005 (or other source of input signals, as described above). The number of memory cells 5010A–5010H, inverters 5015A–5015D, SOI transistors 1008A–1008T, input signals 5005A–5005E, and intermediate nodes 5020A–5020F depends on the value of the integer N, as persons skilled in the art with the benefit of the description of the invention understand.

Similar to embodiment 5000, in embodiment 6000, input signals 5005A–5005E (together with the output signals of inverters 5015A–5015D), control SOI transistors 1008A–1008T. The operation of embodiment 6000 is similar to the operation of embodiment 5000, described above.

As FIG. 6 illustrates, embodiment 6000 includes repeated combinations of circuit elements, for example the combination that includes memory inverter 5015A and SOI transistors 1008A–1008D. The combination of circuit elements that includes inverter 5015A and SOI transistors 1008A–1008D operates in a similar manner to the combination of circuit elements in FIG. 5 that includes inverter 5015A and SOI transistors 1008A–1008D. Likewise, the combination of circuit elements that includes inverter 5015B and SOI transistors 1008E–1008H operates in a similar manner to the similar combination of circuit elements in FIG. 5 (i.e., the combination of inverter 5015A and SOI transistors 1008A–1008D).

Furthermore, the combination of inverters 5015C–5015D and SOI transistors 1008J, 1008P, 1008Q, 1008R, 1008S, and 1008T operates similar to embodiment 5000 in FIG. 5. Thus, using a cascade of SOI transistors, embodiment 6000 provides the output of one of memory cells 5010A–5010H to output 5030, by steering the signal through selected intermediate nodes 5020A–5020F.

Note that one may replicate and/or combine the look-up table circuits described above to realize a desired number and/or configuration of look-up tables with a desired functionality. The appropriate number, configuration, and/or functionality of the look-up table circuits depends on the design and performance specifications for a given application, as persons of ordinary skill in the art who have the benefit of the description of the invention understand.

Unlike look-up table circuits in conventional PLDs, look-up table circuits according to the invention described here can operate from relatively small power-supply voltages. By using SOI pass transistors, look-up table circuits according to the invention can reliably transmit both logic 0 and logic 1 levels even with relatively small power-supply voltages. Note that one may use any of the MOS transistors or structures described below as transistors 1008A–1008F in embodiment 5000 or transistors 1008A–1008T in embodiment 6000, as desired.

As another application, one may also use SOI transistors in logic gates or logic circuitry including logic gates in PLDs according to the invention. The logic gates or logic circuitry may couple to programmable interconnects, pass devices, look-up table circuits, and/or other parts of the PLD, as persons of ordinary skill in the art who have the benefit of the description of the invention understand. Thus, the logic gates or logic circuitry may provide part of the programmable fabric of the PLD, as desired.

Figure 7:
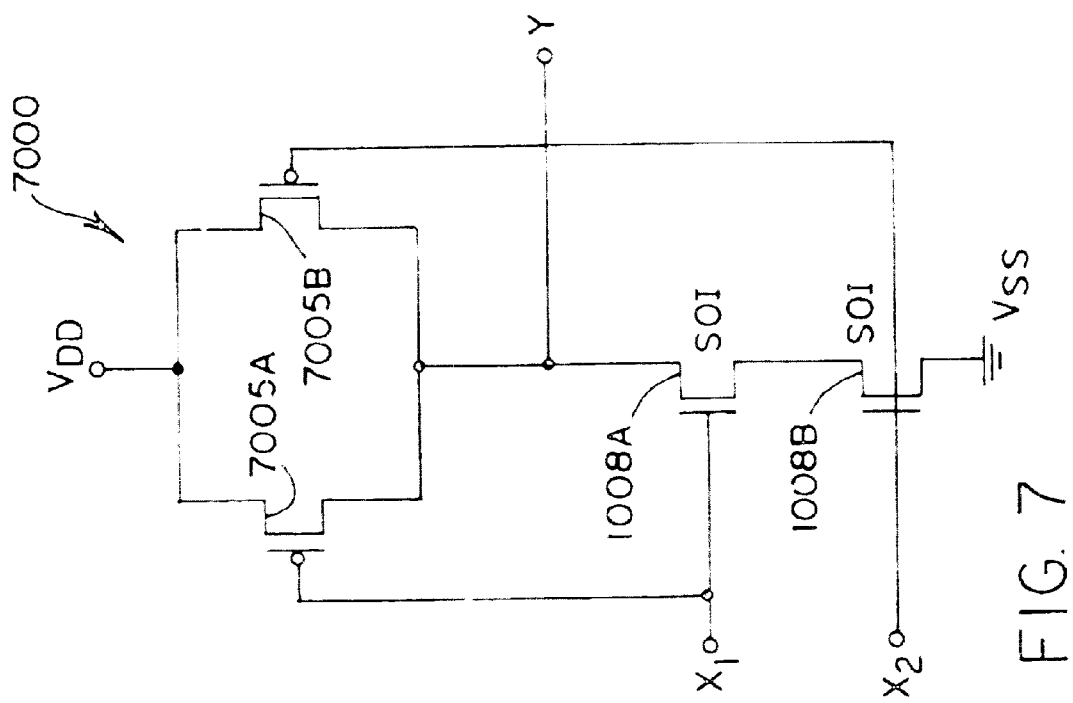
FIG. 7 shows an embodiment of a two-input logic gate for use in PLDs according to the invention.

FIG. 7 shows an embodiment 7000 of a logic gate incorporating SOI transistors for use in a PLD according to the invention. Embodiment 7000 illustrates a two-input NAND gate that includes PMOS transistors 7005A–7005B and SOI NMOS transistors 1008A–1008B. Persons of ordinary skill in the art who have the benefit of the description of the invention understand the operation of embodiment 7000.

A NAND gate in a conventional PLD that uses ordinary NMOS transistors may suffer from degraded performance (e.g., longer switching times). Unlike a two-input NAND gate in a conventional PLD, however, the NAND gate in embodiment 7000 uses SOI NMOS transistors (although, note that one may implement the PMOS transistors using SOI technology, as desired). As a result, the NAND gate when used in PLDs according to the invention provides improved performance (e.g., faster switching times).

Figure 8:
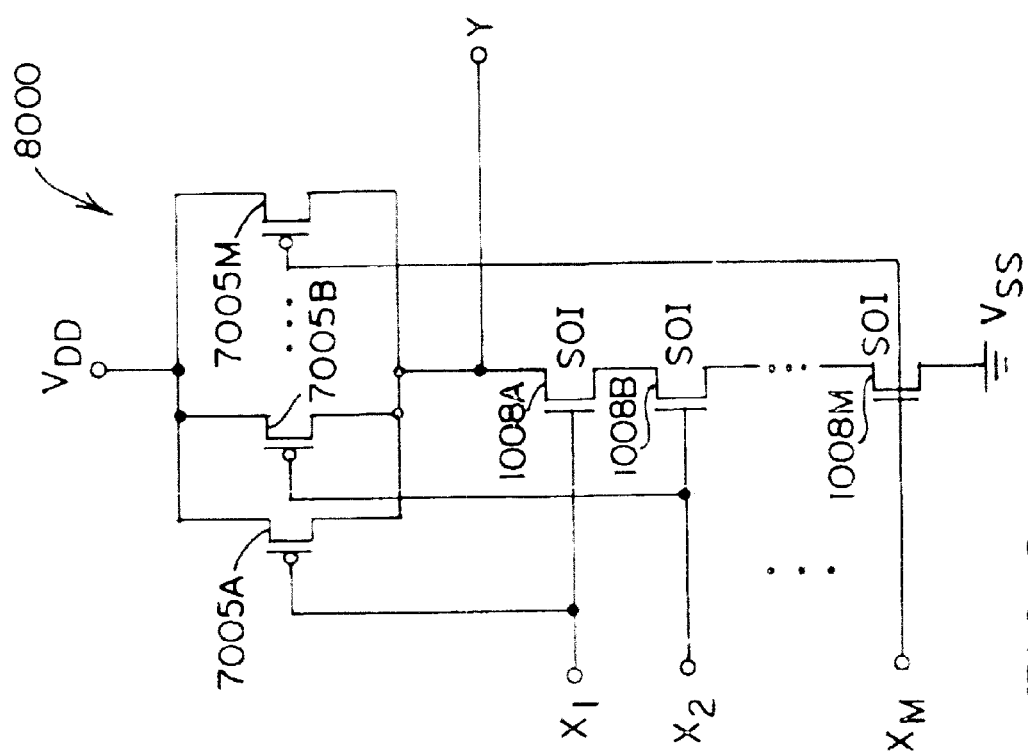
FIG. 8 illustrates another embodiment of a multi-input logic gate for use in PLDs according to the invention.

Note that, rather than two-input NAND gates, one may use NAND gates with more than two inputs. FIG. 8 shows another embodiment 8000 of a NAND gate with SOI transistors for use in a PLD according to the invention. Embodiment 8000 illustrates a NAND gate with M inputs, where M denotes an integer number greater than 2, and includes PMOS transistors 7005A–7005M and SOI NMOS transistors 1008A–1008M. Embodiment 8000 operates in a similar manner to embodiment 7000, as persons skilled in the art understand.

The problem of degraded performance (e.g., long switching time) is even more acute in NAND gates with relatively large numbers of inputs. Unlike conventional NAND gates, however, the NAND gate in embodiment 8000 uses SOI NMOS transistors. As a result, when used in PLDs according to the invention, the NAND gate provides improved performance, such as shorter switching time.

Note that, although FIGS. 7–8 illustrate NAND gates, one may use other logic circuits or gates with SOI transistors in PLDs according to the invention. For example, one may use SOI transistors in AND gates, NOR gates, and OR gates, as persons skilled in the art with the benefit of the description of the invention understand. Furthermore, rather than using CMOS technology, one may realize logic gates with SOI transistors in NMOS technology or PMOS technology, as desired, by making appropriate modifications that fall within the knowledge of persons of ordinary skill in the art who have the benefit of the description of the invention. Furthermore, one may use any of the MOS structures and transistors described below in embodiments 7000 and 8000, as desired.

As persons skilled in the art with the benefit of the description of the invention understand, one may use NAND gates with SOI transistors in a variety of circuitry within PLDs according to the invention. Some examples include look-up table circuits, buffers, control logic, input/output (IO) circuitry, error detection and correction circuitry, and the like.

As noted above, one may use a variety of MOS transistors in PLDs according to the invention, as described below. More specifically, one may use one or more of the MOS transistors described here in embodiments 1000–8000 shown in FIGS. 1–8 and described above.

In one variety of transistor, the gate of the transistor couples to its body region. Doing so creates a dynamic-threshold MOS (DTMOS) transistor. DTMOS transistors can reliably transmit both logic 0 and logic 1 levels, even when used in circuits in PLDs that operate from relatively low power-supply voltages. In contrast, conventional MOS transistors (i.e., without the body region coupled to the gate terminal) may fail to reliably transmit a logic 1 level, as noted above.

The drain current of a conventional MOS transistor in the saturation region of operation depends on the threshold voltage and the gate-to-source voltage of the transistor:

$$i_D = K(v_{GS} - V_T)^2, \qquad (1)$$

where $i_D$=the total drain current (i.e., including AC and DC components),

K=a constant, $v_{GS}$=the total gate-to-source voltage (i.e., including AC and DC components), and $V_T$=the threshold voltage.

The threshold voltage, $V_T$, depends on a number of factors, such as the voltage between the body region and the source region of the transistor. The following equation provides the threshold voltage as a function of the substrate-to-source voltage:

$$V_T = V_{T(0)} + \gamma\{\sqrt{2\Phi_F - v_{BS}} - \sqrt{2\Phi_F}\}. \qquad (2A)$$

Alternatively, one may write Equation 2A in terms of the source-to-body voltage:

$$V_T = V_{T(0)} + \gamma\{\sqrt{2\Phi_F + v_{SB}} - \sqrt{2\Phi_F}\}, \qquad (2B)$$

where $V_{T(0)}$=the threshold voltage with the source-to-body voltage (or body-to-source voltage) set to zero, $\gamma$=the body factor, a constant that depends on the doping levels of the body, $\Phi_F$=a constant, $v_{BS}$=the total body-to-source voltage (i.e., including AC and DC components), and $v_{SB}$=the total source-to-body voltage (i.e., including AC and DC components). Note that when the body-to-source voltage, $v_{BS}$ (or source-to-body voltage, $v_{SB}$) equals zero, the threshold voltage, $V_T$, equals $V_{T(0)}$.

As Equation 2B shows, for a finite body factor, $\gamma$, the transistor's threshold voltage increases as the source-to-body voltage, $v_{SB}$, increases. Equation 1, however, indicates that an increase in the threshold voltage decreases the drain current, $i_D$, of the transistor. In other words, according to Equations 1 and 2B, for a constant gate-to-source-voltage, $v_{GS}$, an increase in the source-to-body voltage, $v_{SB}$, causes an increase in the threshold voltage, $V_T$.

An increased threshold voltage, $V_T$, in turn causes a decrease in the quantity $(v_{GS} - V_T)$ and, consequently, a decrease in the drain current, $i_D$, of the transistor. Thus, for a constant gate-to-source-voltage, $v_{GS}$, an increase in the source-to-body voltage, $v_{SB}$, causes a decrease in the current-drive capability of the transistor. The decreased current-drive capability of the transistor in turn leads to slower circuit operation and, ultimately, to slower operation of the PLD that includes the transistor.

Furthermore, for a given supply voltage, $V_{DD}$, an increase in the threshold voltage, $V_T$, limits the maximum voltage that the transistor can transmit when operating as a pass transistor. In other words, if the threshold voltage, $V_T$, increases to the point that it equals or exceeds the gate-to-source-voltage, $v_{GS}$, the drain current reduces to zero. Thus, a voltage applied to the drain of the transistor, for example, a voltage that corresponds to a logic 1 level, fails to properly transmit to the source of the transistor. Consequently, the transistor fails to operate reliably as a pass transistor.

By coupling the body region to the gate, DTMOS transistors overcome both of the limitations of conventional pass transistors described above. Coupling the body region to the gate results in:

$$v_{BS} = v_{GS}. \qquad (3)$$

In other words, the body-to-source voltage, $v_{BS}$, equals the gate-to-source voltage, $v_{GS}$.

In such a configuration, an increase in the gate-to-source voltage, $v_{GS}$, results in a direct increase in the body-to-source voltage, $v_{BS}$. As Equation 2A shows, however, an increase in the body-to-source voltage, $v_{BS}$, decreases the quantity $\sqrt{2\Phi_F - v_{BS}} - \sqrt{2\Phi_F}$, which results in a decrease in the threshold voltage, $V_T$. In other words, by coupling the gate to the body region of the transistor, one makes a MOS transistor in which one may dynamically change the threshold voltage by varying the gate voltage (hence the name DTMOS transistor).

A decrease in the threshold voltage, $V_T$, allows the DTMOS transistor to have the capability of transmitting higher voltage levels, for example, a logic 1 voltage level. Thus, DTMOS transistors can reliably transmit logic 1 voltage levels in PLDs with relatively low supply voltages. Furthermore, a decrease in the threshold voltage, $V_T$, results in increased current-drive capability and, hence, faster circuit operation. As a result, PLDs according to the invention that contain DTMOS transistors can operate at faster speeds because of the increased current drive capability of the transistors.

Figure 9:
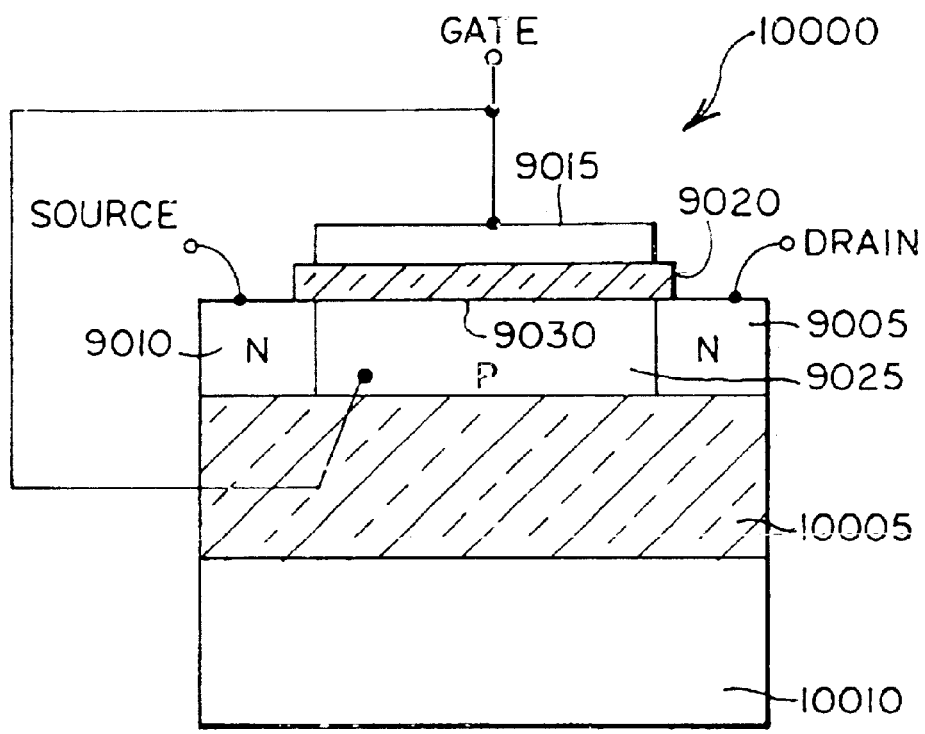
FIG. 9 shows an embodiment of an SOI transistor, with its gate coupled to its body region, for use in PLDs according to the invention.

FIG. 9 illustrates an embodiment 10000 of a DTMOS SOI transistor, with its gate coupled to its body region, for use in PLDs according to the invention. One may use the transistor in embodiment 10000 in any of the circuitry described above for inclusion in a PLD. The transistor in embodiment 10000 has drain region 9005, source region 9010, gate 9015, and body region 9025. A insulator layer 9020 (gate insulator) resides above channel region 9030 of the transistor. Gate 9015 resides above insulator layer 9020. In one embodiment according to the invention, insulator layer 9020 constitutes silicon dioxide ($SiO_2$), although one may use other suitable insulators, as persons of ordinary skill in the art understand.

Unlike a conventional MOS transistor, gate 9015 couples to body region 9025. Accordingly, Equation 3 holds (i.e., $v_{BS} = v_{GS}$). As a result, the threshold voltage, $V_T$, decreases as the gate-to-source voltage, $v_{GS}$, increases, as described above. Put another way, the transistor in embodiment 10000 is a DTMOS transistor. As noted above, DTMOS transistors not only can transmit both logic 0 and logic 1 levels reliably, but PLDs that include DTMOS transistors have higher operating speed.

Also unlike a conventional MOS transistor, the transistor in embodiment 10000 resides above an insulator layer 10005. Consequently, the transistor has an SOI structure. In one illustrative embodiment according to the invention, insulator layer 10005 may constitute silicon dioxide, although one may use other types of insulator, as persons of ordinary skill in the art understand.

Insulator layer 10005 resides above substrate region 10010. In exemplary embodiments according to the invention, substrate region 10010 may constitute the substrate of the PLD die within which embodiment 10000 resides.

By using insulator layer 10005, one may provide an insulated well or region for each implementation of embodiment 10000 in a PLD according to the invention. Using insulator layer 10005 may also decrease parasitic capacitance values of the transistor and, thus, of the PLD. The decrease in parasitic capacitance values increases the operating speed of the transistor in embodiment 10000 and, consequently, of the PLD that contains it.

Figure 10:
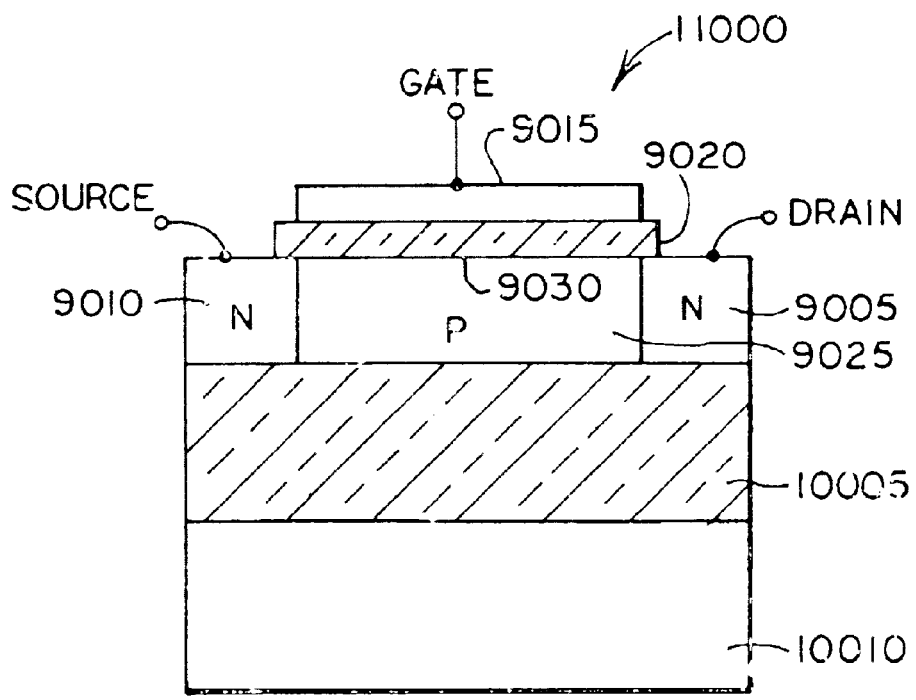
FIG. 10 illustrates a further embodiment of an SOI transistor for use in PLDs according to the invention.

In addition to DTMOS transistors, one may also use other varieties of transistors. FIG. 10 shows an embodiment 11000 of another SOI transistor for use in PLDs according to the invention. One may use the transistor in embodiment 11000 in any of the circuitry described above (see FIGS. 1–8). Note that, unlike embodiment 10000, in embodiment 11000, body 9025 does not couple to gate 9015. Because body 9025 does not couple to gate 9015, the transistor in embodiment 11000 constitutes a floating-body transistor.

The transistor in embodiment 11000 has a similar structure to the transistor in embodiment 10000 (see FIG. 9). Thus, the transistor in embodiment 11000 includes drain region 9005, source region 9010, gate 9015, and body region 9025. Insulator layer 9020 (gate insulator) resides above channel region 9030 of the transistor. Gate 9015 resides above insulator layer 9020. In one illustrative embodiment according to the invention, insulator layer 9020 constitutes silicon dioxide (SiO$_2$), although one may use other suitable insulators, as persons skilled in the art understand.

Unlike a conventional MOS transistor, the transistor resides above insulator layer 10005 or, put another way, it has an SOI structure. In one illustrative embodiment according to the invention, insulator layer 10005 may constitute silicon dioxide, although one may use other types of insulator, as persons of ordinary skill in the art understand.

Similar to embodiment 10000, insulator layer 10005 resides above substrate region 10010. In exemplary embodiments according to the invention, substrate region 10010 may constitute the substrate of the PLD within which embodiment 11000 resides.

By using insulator layer 10005, one may provide an insulated well or region for each implementation of embodiment 11000 in a PLD according to the invention. Use of insulator layer 10005 may also decrease parasitic capacitance values of the transistor and, hence, of the PLD in which the transistor resides. The decrease in parasitic capacitance values increases the operating speed of the transistor in embodiment 11000. As a result, the operating speed of the PLD that includes embodiment 11000 increases.

One may configure embodiment 11000 as either a fully depleted MOS (FDMOS) or partially depleted MOS (PDMOS) transistor. The terms fully depleted and partially depleted refer to a depletion layer (not shown explicitly) in body region 9025 of the transistor. The depletion layer results from an application of a gate potential to gate 9015 of the transistor. In a fully depleted mode of operation, the width of the depletion layer spans body region 9025. On the other hand, in a partially depleted regime, the width of the depletion layer does not span the entire body region 9025. By controlling the characteristics of the transistor, such as the thickness of the body region 9025 and the doping concentrations of various regions of the transistor, one may implement either a PDMOS or an FDMOS transistor, as desired.

DTMOS transistors differ from the FDMOS or PDMOS transistors in several respects. The DTMOS transistors have their gates coupled to their respective bodies. The FDMOS or PDMOS transistors do not use that coupling, thus allowing savings in PLD area and/or the material used (e.g., metal, silicon dioxide, vias, and/or polysilicon) to provide the couplings. As a further result of the lack of gate-body couplings in the FDMOS or PDMOS transistors, implementing and routing PLD interconnects or signal lines to other circuitry in the PLD that includes those transistors may be relatively easy.

On the other hand, FDMOS and PDMOS transistors exhibit a so-called "history effect." The history effect arises because of the finite time it takes for induced charges in body region 9025 to settle once the switching stops. The history effect may lower the effective operating speeds of FDMOS and PDMOS transistors. Consequently, DTMOS transistors may have higher relative operating speeds compared to FDMOS and PDMOS transistors. One may choose to use DTMOS, FDMOS, or PDMOS transistors based on the above factors, as well as factors relating to the design and performance specifications for a given application, as persons skilled in the aft with the benefit of the description of the invention understand.

Figure 11:
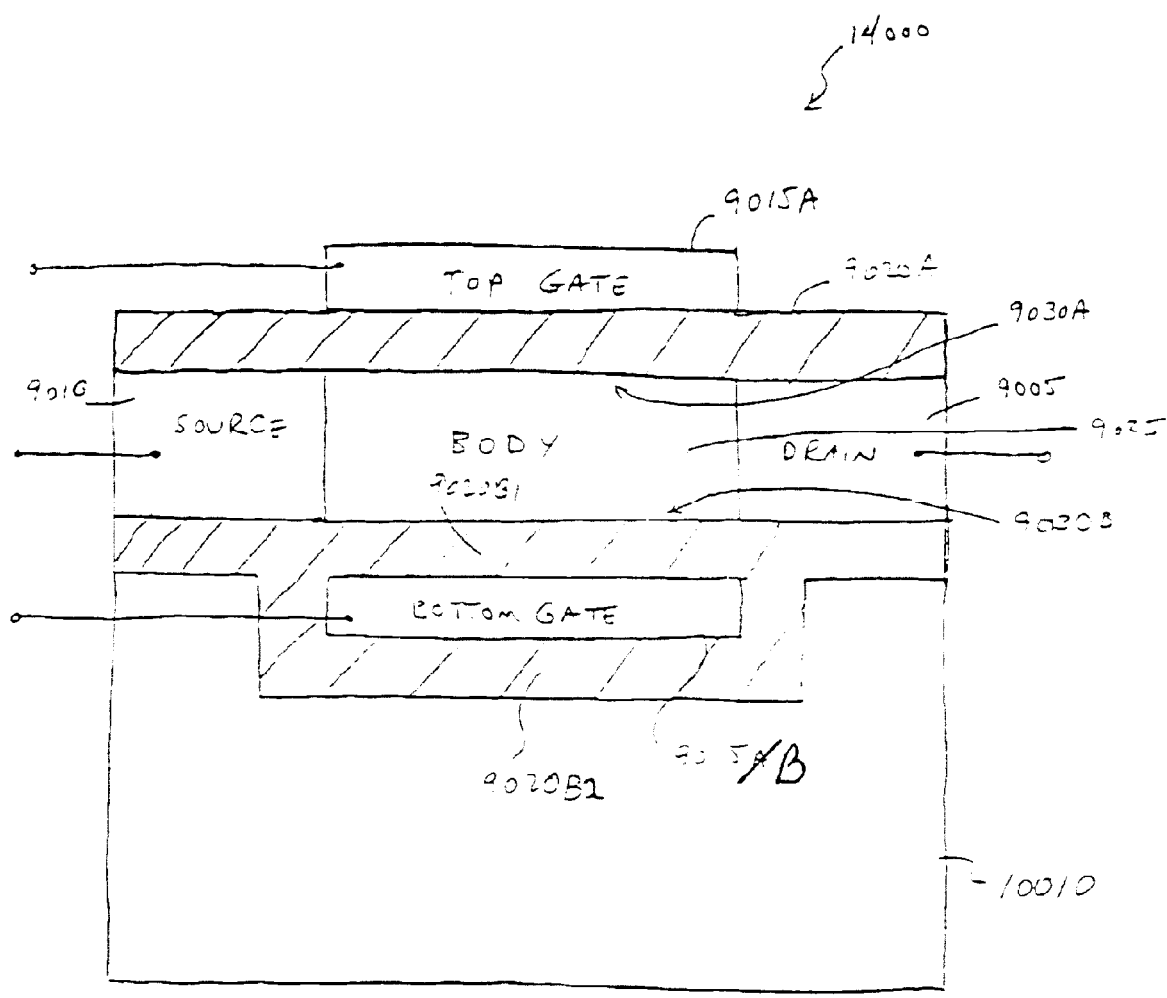
FIG. 11 illustrates an embodiment of a double-gate transistor for use in PLDs according to the invention.

As yet another alternative, one may use double-gate transistors. FIG. 11 shows an embodiment 14000 of an SOI double-gate MOS transistor for use in PLDs according to the invention. One may use the transistor in embodiment 14000 in any of the circuitry described above. The transistor in embodiment 14000 includes drain region 9005, source region 9010, and body region 9025.

Unlike conventional MOS transistors, the transistor in embodiment 14000 has an upper gate 9015A and a lower gate 9015B. An insulator layer 9020A (upper-gate insulator) resides above upper channel region 9030A of the transistor. Upper gate 9015A resides above insulator layer 9020A. Another insulator layer 9020B1 (lower-gate insulator) resides below lower channel region 9030B of the transistor. Lower gate 9015B resides below insulator layer 9020B1.

Insulator layer 9020B2 resides below lower gate 9015B. Substrate 10010 generally resides below insulator layer 9020B2. In one embodiment according to the invention, insulator layers 9020A, 9020B1, and 9020B2 constitute silicon dioxide (SiO$_2$), although one may use other suitable insulators, as desired. In exemplary embodiments according to the invention, substrate region 10010 may constitute the substrate of the PLD within which embodiment 14000 resides.

By using insulator layer 9020B2, one may provide an insulated well or body region for each implementation of embodiment 14000 in a PLD according to the invention. Use of insulator layer 9020B2 may also decrease parasitic capacitance values of the transistor and, thus, of the PLD. The decrease in parasitic capacitance values increases the operating speed and lowers the switching power dissipation of the transistor in embodiment 14000 and, consequently, of the PLD.

One may configure embodiment 14000 as either a fully depleted MOS (FDMOS) or partially depleted MOS (PDMOS) transistor, as desired. By controlling the characteristics of the transistor, such as various doping concentrations, for example, the doping concentrations of body region 9025 and/or channel regions 9030A–9030B, and/or the thickness of insulator layers 9020A and 9020B1, one may implement either a PDMOS or an FDMOS transistor, as desired. The FDMOS and PDMOS configurations have properties similar to those described above in detail.

Furthermore, one may implement embodiment 14000 as a DTMOS transistor, as desired. To configure the transistor as a DTMOS transistor, one may couple upper gate 9015A to lower gate 9015B and to body 9025. Regardless of the particular implementation as DTMOS, PDMOS, or FDMOS, transistors as shown in embodiment 14000 reliably transmit logic 0 and logic 1 levels in PLDs according to the invention.

One may use PLDs that incorporate any of the embodiments shown and described above in a variety of applications, such as data-processing applications. FIGS. 12–15 show illustrative embodiments of data-processing systems that include PLDs according to the invention. Note that the PLDs shown in FIGS. 12–15 may include one or more of the circuitry and/or transistors described above. Furthermore, the various parts of the PLDs, such as programmable interconnects, pass devices or transistors, look-up table circuits, and/or logic gates or logic circuitry may couple together (not shown explicitly in FIGS. 12–15), as described above, and as persons of ordinary skill in the art who have the benefit of the description of the invention understand.

Figure 12:
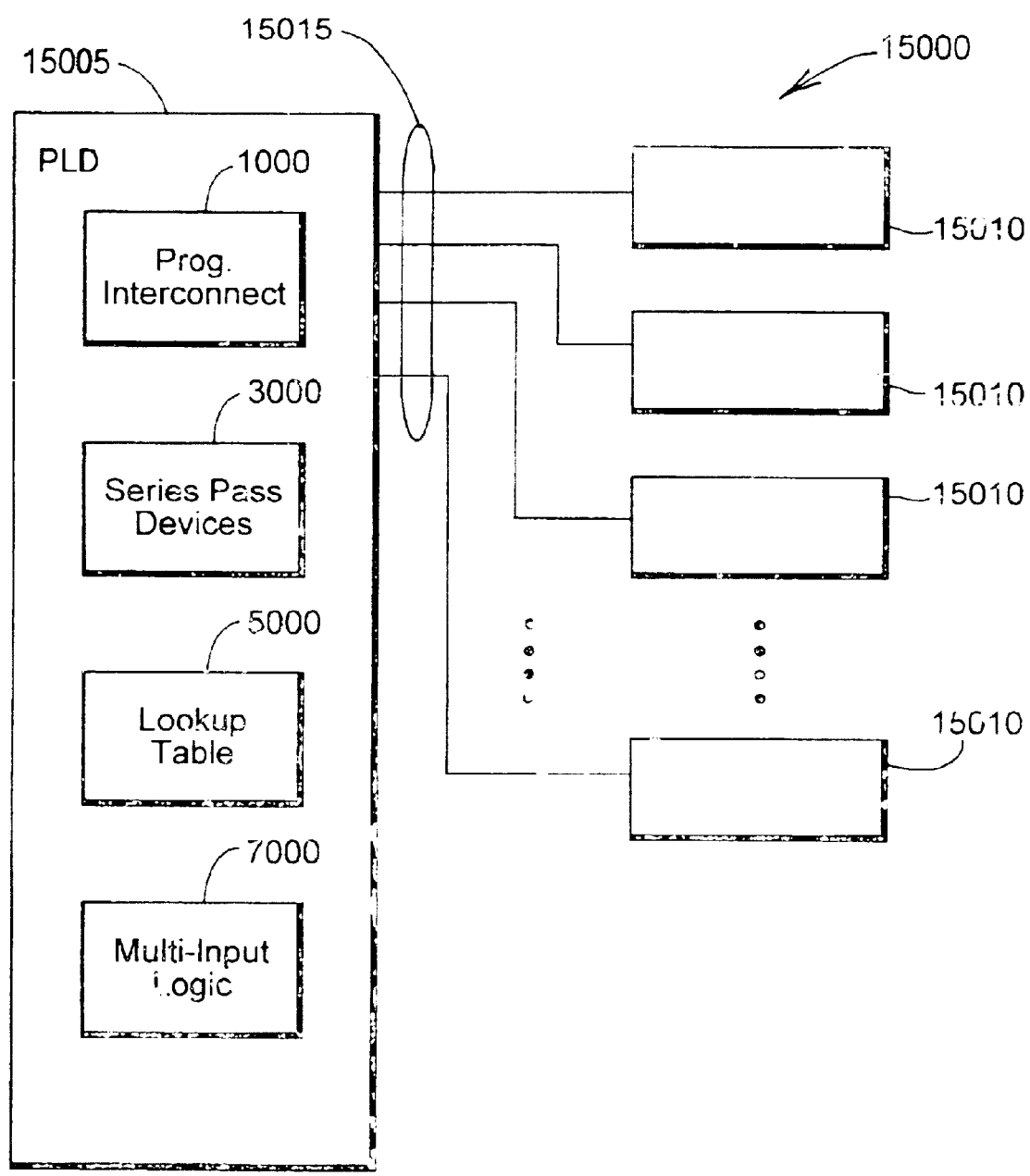
FIG. 12 depicts an embodiment of a data-processing system that includes at least one PLD according to the invention.

FIG. 12 shows an embodiment 15000 of a data-processing system that includes a PLD 15005 according to the invention. Embodiment 15000 also includes one or more peripherals 15010. Peripheral(s) 15010 couple to PLD 15005 via signal links 15015. Signal links 15015 may constitute any suitable signal lines or a collection of a plurality of signal lines (i.e., a plurality of signal lines coupled to each of peripherals 15010, and the collection of the plurality of signal lines constituting signal links 15015).

PLD 15005 may include one or more of the following circuits, described above: (a) programmable interconnect according to embodiments 1000 and/or 2000; (b) series pass device according to embodiments 3000 and/or 4000; (c) look-up table circuit according to embodiments 5000 and/or 6000; and (d) multi-input logic circuits or gates according to embodiments 7000 and/or 8000. The circuitry within PLD 15005, for example, the programmable interconnect or the look-up table circuit or the other circuitry described above, may include MOS transistors according to the embodiments described above.

Peripherals 15010 may include a variety of devices or circuits, as persons skilled in the art with the benefit of the disclosure of the invention recognize. For example, peripherals 15010 may include communication or telecommunication circuitry, video circuitry, audio circuitry, input circuitry, output circuitry, storage circuitry, memory circuitry, and network circuitry, as desired.

Figure 13:
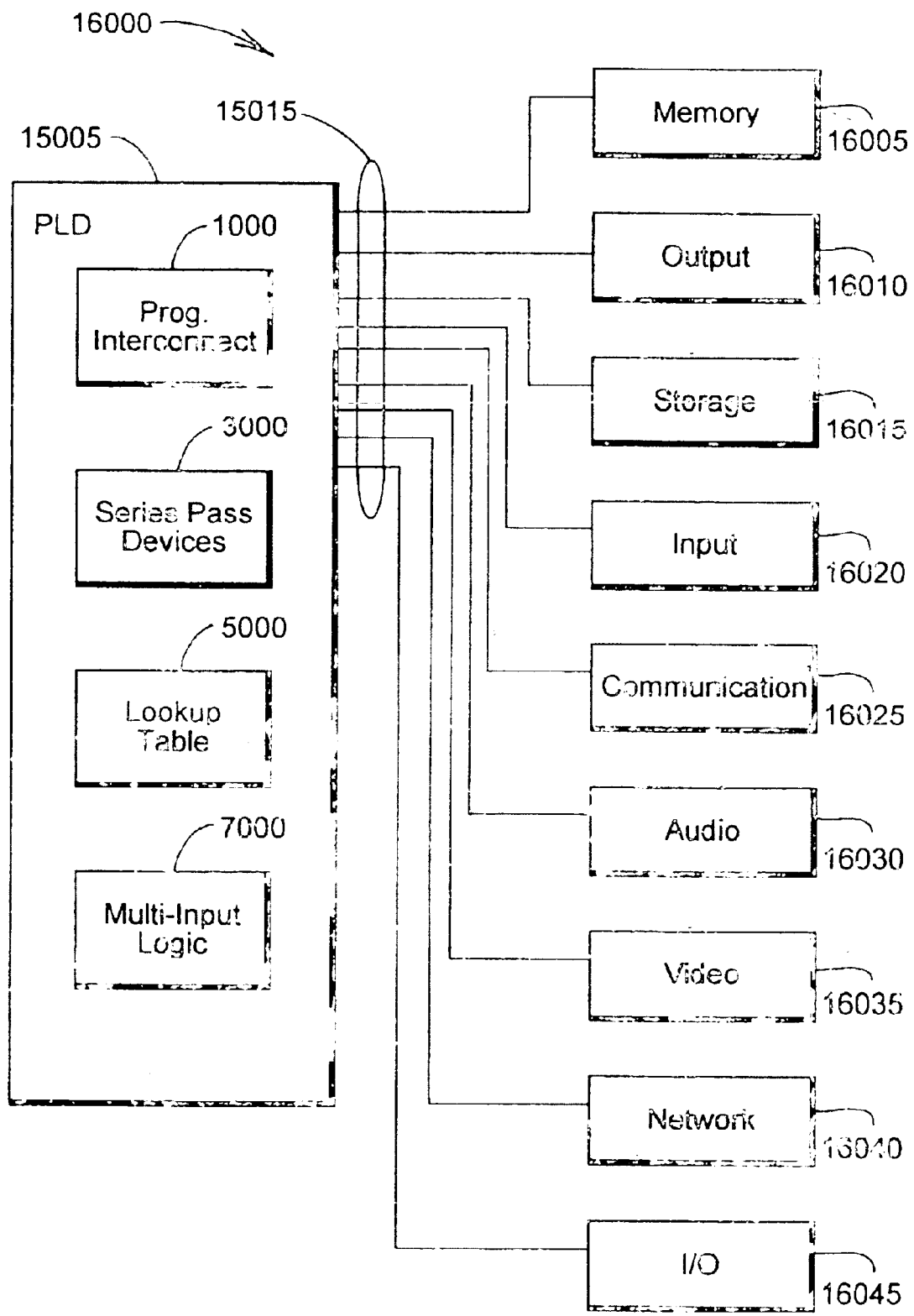
FIG. 13 shows another embodiment of a data-processing system that includes at least one PLD according to the invention.

FIG. 13 shows another embodiment 16000 of a data-processing system that includes PLD 15005 according to the invention. Embodiment 16000 includes a plurality of peripherals 16005–16045 that couple to PLD 15005 via a plurality of signal links 15015. Signal links 15015 may constitute any suitable signal lines or a collection of a plurality of signal lines (i.e., a plurality of signal lines coupled to each of peripherals 16005–16045, and the collection of the plurality of signal lines constituting signal links 15015).

PLD 15005 may include one or more of the following circuitry: (a) programmable interconnect according to embodiments 1000 and/or 2000; (b) series pass device according to embodiments 3000 and/or 4000; (c) look-up table circuit according to embodiments 5000 and/or 6000; and (d) multi-input logic circuits or gates according to embodiments 7000 and/or 8000. The circuitry within PLD 15005, for example, the programmable interconnect or the look-up table circuit or any of the other circuitry described above, may include MOS transistors according to the embodiments described above.

Peripherals 16005–16045 include one or more memory 16005 (e.g., SDRAM circuitry and associated controller), output circuitry 16010 (e.g., a printer), storage circuitry 16015 (e.g., a hard drive), input circuitry 16020 (e.g., a keyboard), communication circuitry 16025 (e.g., a modem), audio circuitry 16030 (e.g., sound card, speakers), video circuitry 16035 (e.g., a video controller, monitor, or both), network circuitry 16040 (e.g., an Ethernet controller or network interface card), and I/O circuitry 16045 (e.g., game controller or joystick). As persons skilled in the art recognize, however, one may use other peripheral devices and circuits, as desired. Furthermore, one may include more or fewer peripheral devices or circuits than shown, as desired.

Figure 14:
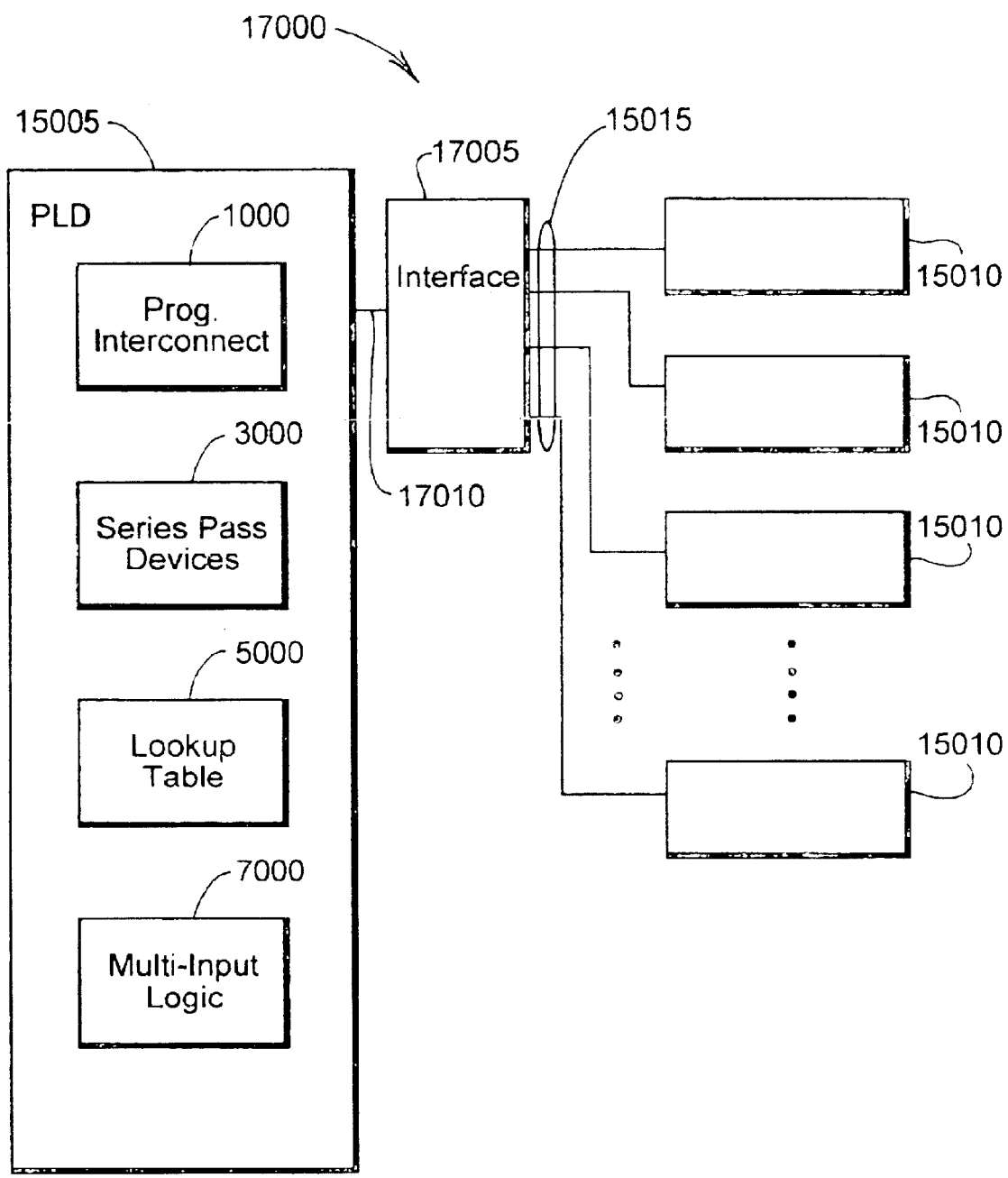
FIG. 14 illustrates a further embodiment of a data-processing system that includes at least one PLD according to the invention.

FIG. 14 shows an alternative embodiment 17000 of a data-processing system that includes PLD 15005 according to the invention. PLD 15005 may include one or more of the following circuitry: (a) programmable interconnect according to embodiments 1000 and/or 2000; (b) series pass device according to embodiments 3000 and/or 4000; (c) look-up table circuit according to embodiments 5000 and/or 6000; and (d) multi-input logic circuits or gates according to embodiments 7000 and/or 8000. The circuitry within PLD 15005, for example, the programmable interconnect or the look-up table circuit or other circuitry described above, may include MOS transistors according to the embodiments described above.

Embodiment 17000 also includes one or more peripherals 15010. Peripheral(s) 15010 couple to PLD 15005 via interface circuit 17005. Peripherals 15010 may include a variety of devices or circuits, as persons skilled in the art recognize. For example, peripherals 15010 may include communication or telecommunication circuitry, video circuitry, audio circuitry, input circuitry, output circuitry, storage circuitry, memory circuitry, and network circuitry, as desired.

Peripherals 15010 couple to interface circuit 17005 via signal links 15015. Signal links 15015 may constitute any suitable signal lines or a collection of a plurality of signal lines (i.e., a plurality of signal lines coupled to each of peripherals 15010, and the collection of the plurality of signal lines constituting signal links 15015).

Interface circuit 17005 couples to PLD 15005 via a signal link 17010. Signal link 17010 may constitute any suitable line or link, for example, a bus or multiple buses (such as address and data buses), as desired. Furthermore, signal link 17010 may include one or more separate or specialized status, data, and/or control signals, as desired.

Using signal links 15015 and 17010, the interface circuit 17005 communicates data signals, status signals, and/or control signals between PLD 15005 and peripherals 15010. Interface circuit 17005 may also control the operation of peripherals 15010, either individually, or with the supervision of PLD 15005, as desired.

Figure 15:
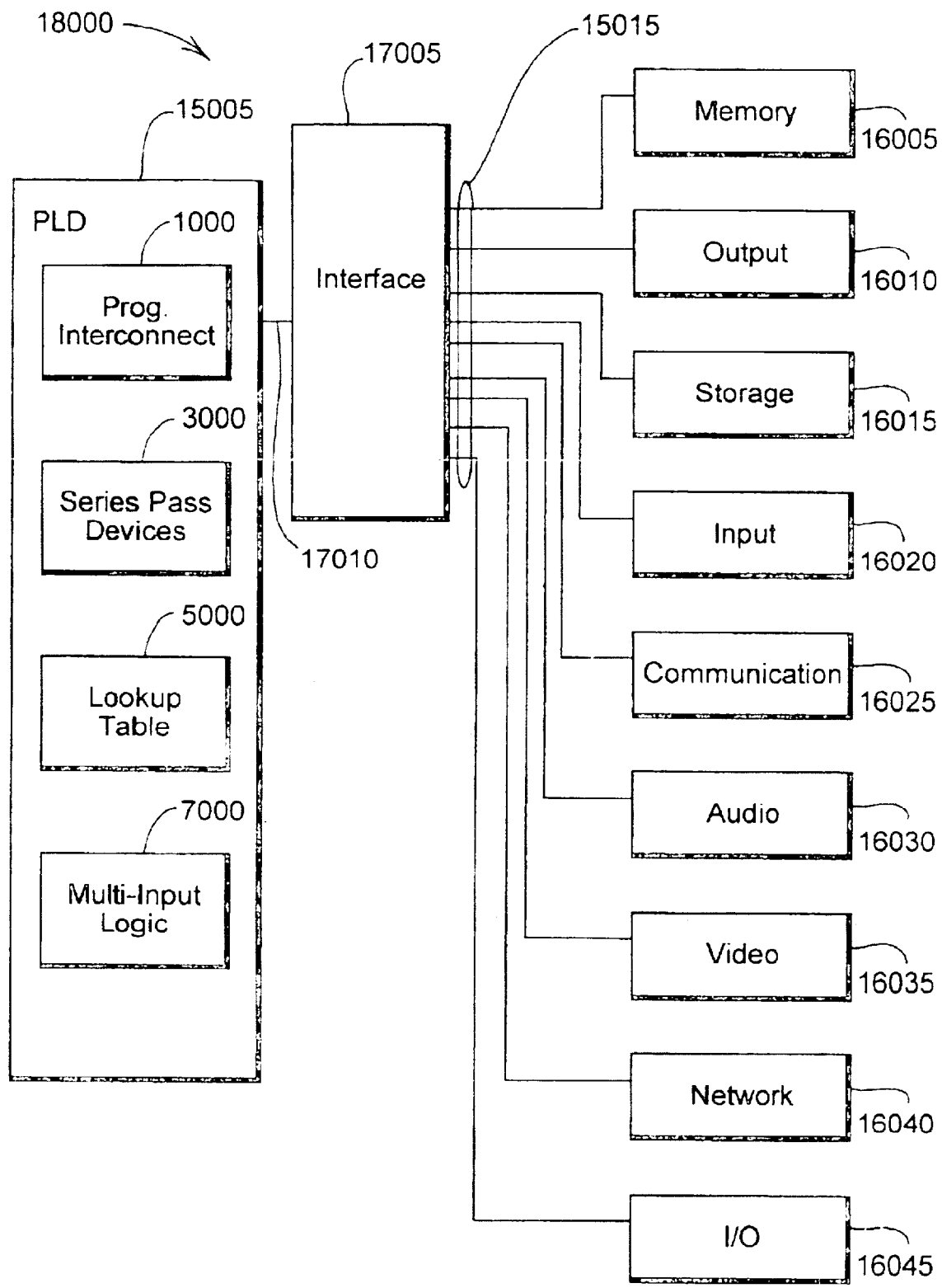
FIG. 15 depicts an additional embodiment of a data-processing system that includes at least one PLD according to the invention.
Figure 2:
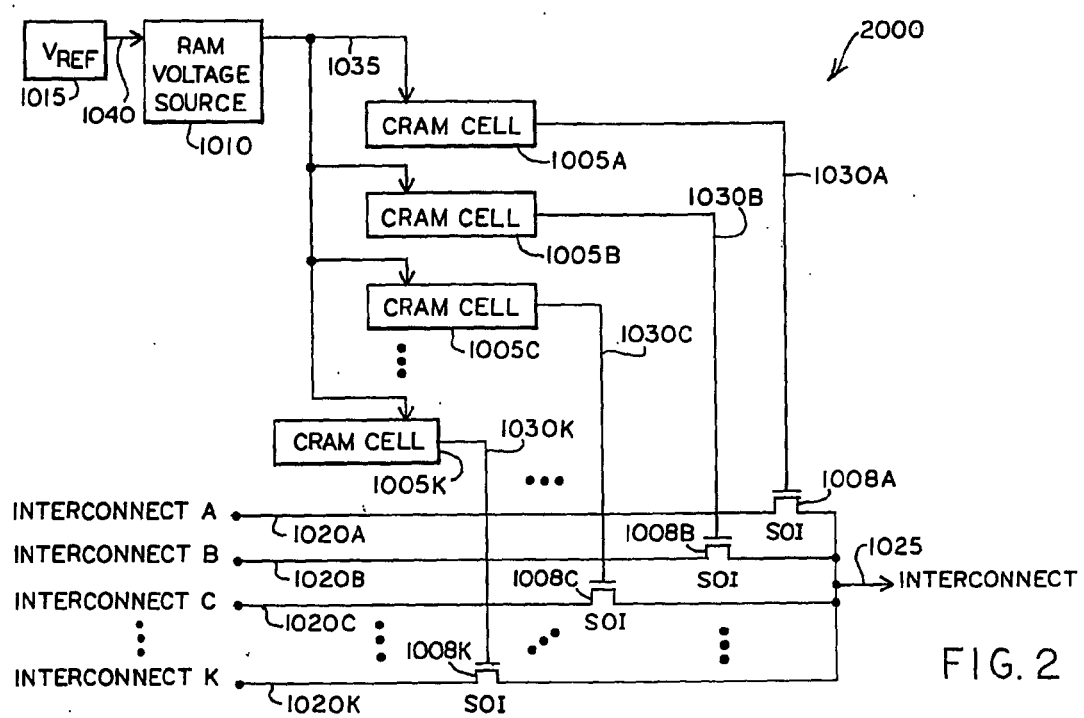
Figure 6:
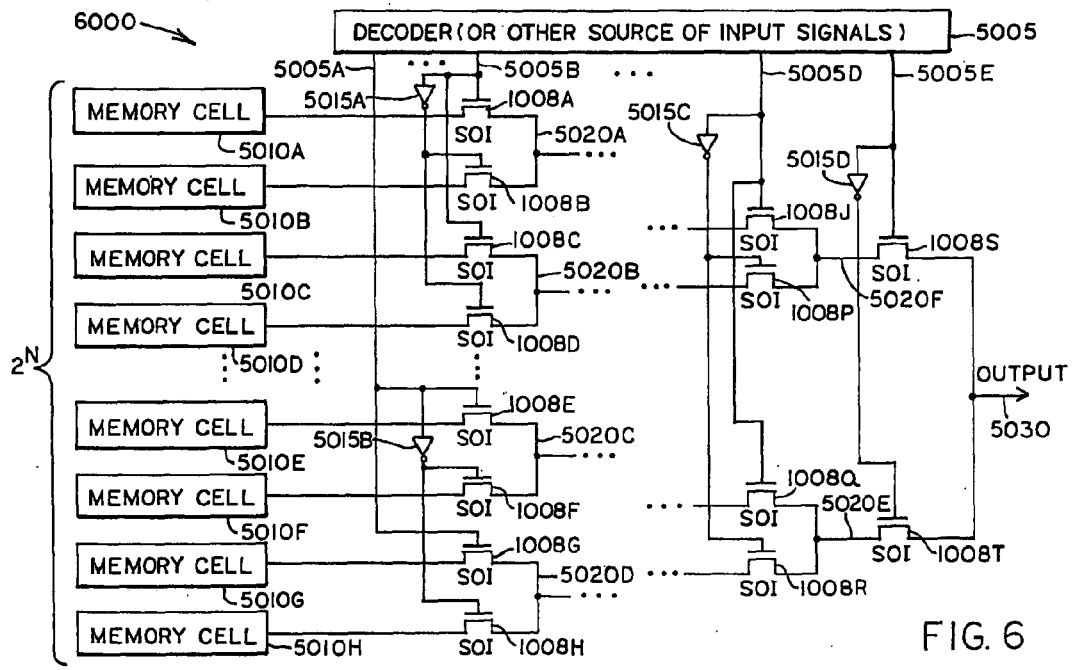
Figure 11:
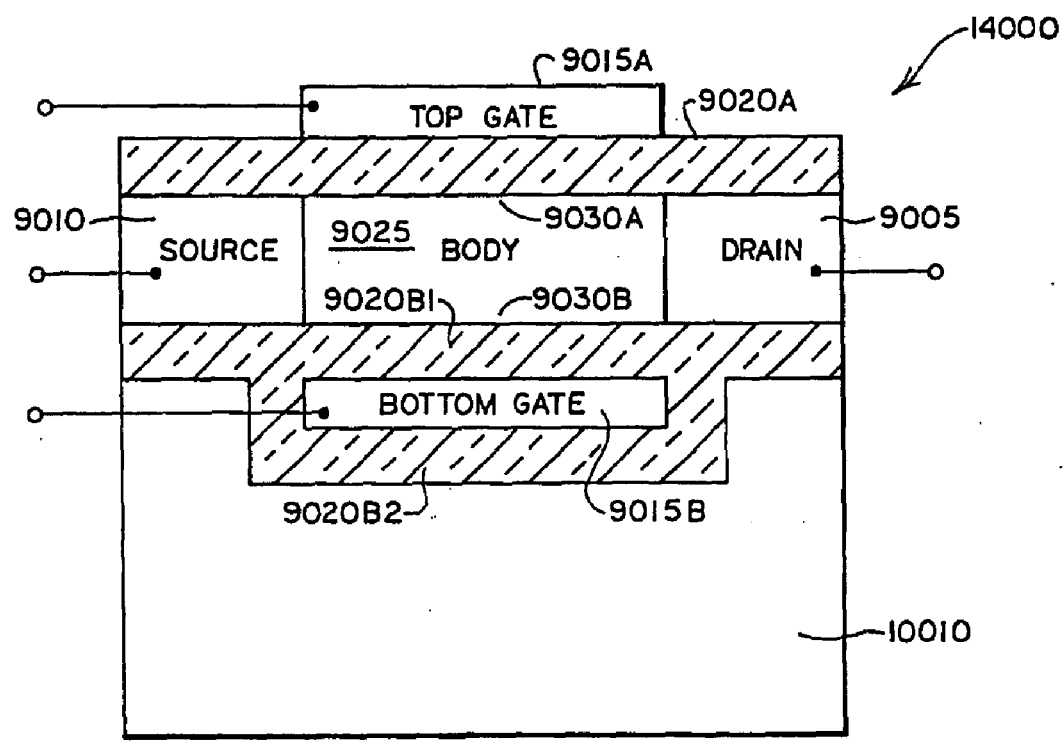

FIG. 15 illustrates another alternative embodiment 18000 of a data-processing system that includes PLD 15005 according to the invention. PLD 15005 may include one or more of the following circuitry: (a) programmable interconnect according to embodiments 1000 and/or 2000; (b) series pass device according to embodiments 3000 and/or 4000; (c) look-up table circuit according to embodiments 5000 and/or 6000; and (d) multi-input logic circuits or gates according to embodiments 7000 and/or 8000. The circuitry within PLD 15005, for example, the programmable interconnect or the look-up table circuit or other circuitry described above, may include MOS transistors according to the embodiments described above.

Embodiment 18000 includes a plurality of peripherals 16005–16045. Peripherals 16005–16045 include one or more memory 16005 (e.g., SDRAM circuitry and associated controller), output circuitry 16010 (e.g., a printer), storage circuitry 16015 (e.g., a hard drive), input circuitry 16020 (e.g., a keyboard), communication circuitry 16025 (e.g., a modem), audio circuitry 16030 (e.g., sound card, speakers), video circuitry 16035 (e.g. a video controller, monitor, or both), network circuitry 16040 (e.g., an Ethernet controller or network interface card), and I/O circuitry 16045 (e.g., game controller or joystick). As persons skilled in the art will recognize, however, one may use other peripheral devices and circuits, as desired. Furthermore, one may include more or fewer peripheral devices or circuits than shown, as desired.

Similar to embodiment 17000, peripherals 16005–16045 in embodiment 18000 couple to interface circuit 17005 via signal links 15015. Signal links 15015 may constitute any suitable signal lines or a collection of a plurality of signal lines (i.e., a plurality of signal lines coupled to each of peripherals 16005–16045, and the collection of the plurality of signal lines constituting signal links 15015).

Interface circuit 17005 couples to PLD 15005 via a signal link 17010. Signal link 17010 may constitute any suitable line or link, for example, a bus or multiple buses (such as address and data buses), as desired. Furthermore, signal link 17010 may include one or more separate or specialized status, data, and/or control signals, as desired.

Using signal links 15015 and 17010, interface circuit 17005 communicates data signals, status signals, and/or control signals between PLD 15005 and peripherals 16005–16045. Interface circuit 17005 may also control the operation of peripherals 16005–16045, either individually, or with the supervision of PLD 15005, as desired.

Referring to FIGS. 12 and 14, PLD 15005 (and/or one or more of peripherals 15010) may also include one or more processors, as desired. The processor or processors may couple (not shown explicitly) to various parts of the PLD (such as the programmable interconnect, pass devices or transistors, look-up table circuits, and/or logic gates or logic circuitry) and/or peripherals 15010. The processor or processors may operate on the data within the data-processing systems and decode and execute instructions. The processor or processors may couple to and/or communicate with peripherals 15010, as desired. Note that more than one of peripherals 15010 may couple to and/or communicate with a given processor, as desired. Note further that more than one processor may couple to and/or communicate with a given one of peripherals 15010, as desired.

Similarly, referring to FIGS. 13 and 15, PLD 15005 (and/or one or more of peripherals 16005–16045) may also include one or more processors, as desired. The processor or processors may couple (not shown explicitly) to various parts of the PLD (such as the programmable interconnect, pass devices or transistors, look-up table circuits, and/or logic gates or logic circuitry) and/or peripherals 16005–16045. The processor or processors may operate on the data within the data-processing systems and decode and execute instructions. The processor or processors may couple to and/or communicate with peripherals 16005–16045, as desired. Note that more than one of peripherals 16005–16045 may couple to and/or communicate with a given processor, as desired. Note further that more than one processor may couple to and/or communicate with a given one of peripherals 16005–16045, as desired.

Although FIGS. 12–15 show PLD 15005 as including programmable interconnect, series pass devices, look-up table circuit, and multi-input logic circuit or gate, note that one may use each of such circuits and devices alone in a given data-processing system, as desired. For example, one may use a data-processing system that includes a PLD that includes only programmable interconnects according to the invention. As another example, one may have a data-processing system that uses a PLD with only look-up table circuits according to the invention. Furthermore, one may combine one or more such devices in a PLD according to the invention. In addition to the data-processing systems shown in FIGS. 12–15, one may use other data-processing systems that use PLDs according to the invention, as persons of ordinary skill in the art who have the benefit of the description of the invention understand.

As noted above, one may use any of the varieties of MOS structures and transistors described above in PLDs according to the invention. More specifically, one may use any of the different kinds of MOS structures and transistors in programmable interconnect, series pass devices, look-up table circuits, and multi-input logic circuits or gates within PLDs according to the invention. Each of those MOS structures and transistors described above provide reliable transmission of logic 0 and logic 1 levels in PLDs according to the invention. In addition, using the SOI transistors in PLDs according to the invention may provide other benefits, such as decreased parasitic capacitance, increased operating speeds, and/or decreased switching power dissipation.

The circuitry in the embodiments described above use N-type MOS (NMOS) or CMOS configurations because use of N-type MOS transistors or CMOS circuits generally tends to lead to a more compact PLD. Note, however, that rather than using N-type MOS transistors, one may use P-type MOS transistors, as desired, by making modifications that fall within the knowledge of persons of ordinary skill in the art that have the benefit of the description of the invention. In addition, one may use a combination of N-type MOS and p-type MOS transistors and/or CMOS circuitry, as persons skilled in the art understand.

Furthermore, note that, although the description of the exemplary embodiments pertains to active-high logic circuitry, one may use active-low logic circuitry, as desired, by making modifications to the described embodiments that fall within the knowledge of persons skilled in the art with the benefit of the description of the invention. For example, one may replace NMOS transistors with PMOS transistors, and the like, when using active-low logic circuitry.

The exemplary embodiments of the invention described here pertain to using a variety of disclosed transistors in programmable interconnect, pass devices or transistors, look-up table circuits, and/or multi-input logic circuits or gates in PLDs. Note, however, that one may generally use the disclosed transistors in other areas of PLDs, as persons of ordinary skill in the art who have the benefit of the description of the invention understand. Furthermore, in addition to the transistors labeled as "SOI" in the accompanying figures, one may implement other transistors in the illustrated circuitry as SOI transistors. As persons of ordinary skill in the art with the benefit of the description of the invention understand, one may implement each SOI transistor using any of the varieties of transistors described here.

Referring to the figures, the various blocks shown depict mainly the conceptual functions and signal flow. The actual circuit implementation may or may not contain separately identifiable hardware for the various functional blocks. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation, as persons of ordinary skill in the art who have read the disclosure of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only.

The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

I claim:

1. A programmable logic device (PLD) that includes silicon-on-insulator (SOI) transistors, comprising:
    programmable interconnect circuitry including a first silicon-on-insulator transistor, the programmable interconnect circuitry adapted to provide configurable interconnections within the programmable logic device;
    a silicon-on-insulator pass transistor, the silicon-on-insulator pass transistor coupled to the programmable interconnect circuitry; and
    a look-up table circuit including a second silicon-on-insulator transistor, the look-up table circuit coupled to the programmable interconnect circuitry.

2. The programmable logic device (PLD) according to claim 1, wherein the first silicon-on-insulator transistors comprises: (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or (d) a double-gate metal oxide semiconductor transistor.

3. The programmable logic device (PLD) according to claim 2, wherein the silicon-on-insulator pass transistor comprises: (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or (d) a double-gate metal oxide semiconductor transistor.

4. The programmable logic device (PLD) according to claim 3, wherein the second silicon-on-insulator transistor comprises: (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or(d) a double-gate metal oxide semiconductor transistor.

5. The programmable logic device (PLD) according to claim 4, further comprising a multi-input logic circuit coupled to the programmable interconnect circuitry, the multi-input logic circuit comprising a third silicon-on-insulator transistor.

6. The programmable logic device (PLD) according to claim 5, wherein the third silicon-on-insulator transistor comprises: (a) a dynamic threshold metal oxide semiconductor (DTMOS) transistor, (b) a fully depleted metal oxide semiconductor (FDMOS) transistor, (c) a partially depleted metal oxide semiconductor (PDMOS) transistor, or (d) a double-gate metal oxide semiconductor transistor.

7. The programmable logic device (PLD) according to claim 6, wherein the programmable logic device includes complementary metal oxide semiconductor (CMOS) circuitry.

8. The programmable logic device (PLD) according to claim 7, wherein the multi-input logic circuit comprises at least one multi-input NAND gate, or at least one multi-input NOR gate, or a combination thereof.

9. The programmable logic device (PLD) according to claim 7, wherein the multi-input logic circuit comprises at least one multi-input AND gate, or at least one multi-input OR gate, or a combination thereof.

10. A programmable logic device (PLD), comprising:
    programmable interconnect circuitry including at least one dynamic threshold metal oxide semiconductor silicon-on-insulator transistor, the programmable interconnect circuitry adapted to couple together electronic circuitry within the programmable logic device;
    a dynamic threshold metal oxide semiconductor silicon-on-insulator pass transistor, the dynamic threshold metal oxide semiconductor silicon-on-insulator pass transistor coupled to the programmable interconnect circuitry; and
    a look-up table circuit including at least one dynamic threshold metal oxide semiconductor silicon-on-insulator transistor, the look-up table circuit coupled to the programmable interconnect circuitry.

11. The programmable logic device (PLD) according to claim 10, further comprising a multi-input logic gate coupled to the programmable interconnect circuitry, the multi-input logic gate comprising at least one dynamic threshold metal oxide semiconductor silicon-on-insulator transistor.

12. The programmable logic device (PLD) according to claim 11, wherein at least one of the programmable interconnect circuitry, the dynamic threshold metal oxide semiconductor silicon-on-insulator pass transistor, or the look-up table circuit includes complementary metal oxide semiconductor (CMOS) circuitry.

13. The programmable logic device (PLD) according to claim 12, wherein the multi-input logic gate comprises a multi-input NAND gate or a multi-input NOR gate.

14. The programmable logic device (PLD) according to claim 13, wherein the multi-input logic gate comprises a multi-input AND gate or a multi-input OR gate.

* * * * *

UNITED STATES PATENT AND TRADEMARK OFFICE
CERTIFICATE OF CORRECTION

PATENT NO.    : 6,781,409 B2
DATED         : August 24, 2004
INVENTOR(S)   : John Turner It is certified that error appears in the above-identified patent and that said Letters Patent is hereby corrected as shown below:

Drawings,
Substitute figures 2, 6, and 11 (see attached sheets)

Signed and Sealed this

Seventh Day of December, 2004

JON W. DUDAS
*Director of the United States Patent and Trademark Office*